United States Patent
Kato et al.

(10) Patent No.: US 9,093,490 B2
(45) Date of Patent: Jul. 28, 2015

(54) FILM DEPOSITION APPARATUS

(75) Inventors: Hitoshi Kato, Oshu (JP); Manabu Honma, Oshu (JP); Hiroyuki Kikuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1126 days.

(21) Appl. No.: 12/713,317

(22) Filed: Feb. 26, 2010

(65) Prior Publication Data

US 2010/0229797 A1   Sep. 16, 2010

(30) Foreign Application Priority Data

Mar. 13, 2009   (JP) ................. 2009-061350

(51) Int. Cl.
| | | |
|---|---|---|
| *C23C 16/455* | (2006.01) | |
| *C23C 16/40* | (2006.01) | |
| *H01L 21/677* | (2006.01) | |
| *H01L 21/687* | (2006.01) | |

(52) U.S. Cl.
CPC ........ *H01L 21/68764* (2013.01); *C23C 16/402* (2013.01); *C23C 16/45551* (2013.01); *C23C 16/45578* (2013.01); *C23C 16/45589* (2013.01); *H01L 21/68771* (2013.01)

(58) Field of Classification Search
USPC ......................................................... 118/719
See application file for complete search history.

(56) References Cited

U.S. PATENT DOCUMENTS

| | | | | |
|---|---|---|---|---|
| 5,522,934 A | * | 6/1996 | Suzuki et al. | 118/723 AN |
| 5,634,593 A | * | 6/1997 | Jenkins | 239/69 |
| 8,043,432 B2 | * | 10/2011 | Dip | 118/719 |
| 2002/0134507 A1 | * | 9/2002 | DeDontney et al. | 156/345.33 |
| 2003/0194493 A1 | * | 10/2003 | Chang et al. | 427/248.1 |
| 2004/0129212 A1 | * | 7/2004 | Gadgil et al. | 118/715 |
| 2005/0084610 A1 | * | 4/2005 | Selitser | 427/248.1 |
| 2007/0218702 A1 | * | 9/2007 | Shimizu et al. | 438/758 |
| 2008/0226842 A1 | * | 9/2008 | Vukovic | 427/595 |
| 2009/0017190 A1 | * | 1/2009 | Sferlazzo et al. | 427/10 |
| 2009/0288604 A1 | * | 11/2009 | Kim et al. | 118/726 |
| 2009/0304924 A1 | * | 12/2009 | Gadgil | 427/255.5 |
| 2010/0098851 A1 | * | 4/2010 | Murakawa et al. | 427/248.1 |

FOREIGN PATENT DOCUMENTS

| | | |
|---|---|---|
| JP | 01-310533 | 12/1989 |
| JP | 3144664 | 1/2001 |
| JP | 2001-254181 | 9/2001 |

* cited by examiner

*Primary Examiner* — Karla Moore
(74) *Attorney, Agent, or Firm* — IPUSA, PLLC

(57) ABSTRACT

A disclosed film deposition apparatus for depositing a film on a substrate by supplying a reaction gas to an upper surface of the substrate in a vacuum chamber includes a susceptor provided in the vacuum chamber, wherein substrate receiving areas are formed along a circle whose center lies in a center portion of the susceptor; a main gas supplying portion provided opposing the susceptor in order to supply the reaction gas to the substrate receiving areas of the susceptor; a compensation gas supplying portion configured to supply the reaction gas to an upper surface of the susceptor in order to compensate for concentration of the reaction gas supplied from the main gas supplying portion along a radius direction of the susceptor; and a rotation mechanism configured to rotate the susceptor relative to the main gas supplying portion and the compensation gas supplying portion around the center portion of the susceptor.

10 Claims, 25 Drawing Sheets

FILM DEPOSITION APPARATUS

CROSS-REFERENCE TO RELATED APPLICATION

This application claims the benefit of priority of Japanese Patent Application No. 2009-061350, filed on Mar. 13, 2009 with the Japanese Patent Office, the entire contents of which are hereby incorporated by reference.

BACKGROUND OF THE INVENTION

1. Field of the Invention

The present invention relates to a film deposition apparatus for depositing a film on a substrate by supplying a reaction gas to an upper surface of the substrate.

2. Description of the Related Art

In a semiconductor fabrication process, a film deposition method has been known that is called an atomic layer deposition (ALD) method or a molecular layer deposition (MLD) method where after a first reaction gas is adsorbed on an upper surface of a semiconductor wafer (simply referred to as wafer hereinafter) serving as a substrate, a second reaction gas is adsorbed on the upper surface, so that one or more atomic (or molecular) layers are produced through chemical reaction of the first and the second reaction gases on the surface of the wafer, and then this cycle is repeated plural times. Because a thickness of the thin film can be controlled at higher accuracy by the number of the cycles and the deposited film can have excellent uniformity across the wafer, this deposition method is thought to be promising as a film deposition technique that can address further miniaturization of semiconductor devices.

Such a film deposition method may be preferably used, for example, for depositing a dielectric material to be used as a gate insulator. When a silicon oxide film is deposited as the gate insulator, a bis (tertiary-butylamino) silane (BTBAS) gas or the like is used as a first reaction gas (source gas) and ozone ($O_3$) gas or the like is used as a second gas (oxidation gas).

In order to carry out such a deposition method, use of a single-wafer deposition apparatus having a vacuum chamber and a shower head at a top center portion of the vacuum chamber has been under consideration. In such a deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and apparatus that enable high throughput is desired.

Under these circumstances, there have been proposed film deposition apparatuses having a vacuum chamber and a rotation table that holds plural substrates along a rotation direction, where the reaction gases are alternately supplied to the plural substrates by rotating the rotation table. For example, Patent Document 1 listed below discloses a film deposition apparatus including a process chamber divided into plural process spaces to which different reaction gases are supplied from corresponding ceiling portions, and a rotation table that allows the substrates placed thereon to alternately pass through the plural process spaces.

In addition, Patent Document 2 discloses a film deposition apparatus including, for example, two reaction gas nozzles that eject different reaction gases toward a rotatable table on which plural substrates are placed. In this film deposition apparatus, the plural substrates can alternately pass through and below the reaction gas nozzles by rotating the rotatable table, thereby alternately supplying the reaction gases to the substrates. Such a film deposition apparatus can improve production throughput because a purge step for purging the reaction gases is not necessary and the plural substrates can be processed in one run.

However, there may be a problem in that a gas concentration is varied along a radius direction of the rotatable table in such a film deposition apparatus where the substrates are exposed to the reaction gases by rotating the rotatable table. This is partly because tangential speeds of the rotatable table become higher toward a circumferential edge from a rotation center portion of the rotatable table, which affects in an unexpected manner a flow pattern of the reaction gases flowing over the rotatable table.

In the film deposition apparatus disclosed in Patent Document 2, where a purge gas is preferably supplied in order to separate the reaction gases supplied from the corresponding reaction gas nozzles, because an amount of the purge gas flowing into areas where the reaction gases are supplied may vary depending on process conditions, this may lead to a varied gas concentration along the radius direction of the rotatable table.

Moreover, even when the same reaction gas is supplied as a first reaction gas and a second reaction gas, if a target thickness of the film to be deposited and the process conditions such as a rotation speed of the rotatable table, a process pressure, and the like are changed, the flow pattern of the reaction gas may be easily changed, which may degrade thickness uniformity of the film. Because further improvement in film uniformity is desired in view of recent demands for further reduced patterns, a film deposition apparatus capable of improving a reaction gas concentration along a radius direction of a substrate and addressing changes in the process conditions has been desired.

Patent Document 1: Japanese Patent Publication No. 3,144,664 (FIGS. 1, 2, claim 1)

Patent Document 2: Japanese Patent Application Laid-Open Publication No. 2001-254181 (FIGS. 1 and 2)

SUMMARY OF THE INVENTION

The present invention has been made in view of the above, and provides a film deposition apparatus capable of improving across substrate uniformity of a film deposited on a substrate.

DETAILED DESCRIPTION OF THE PREFERRED EMBODIMENT

Figure 1:
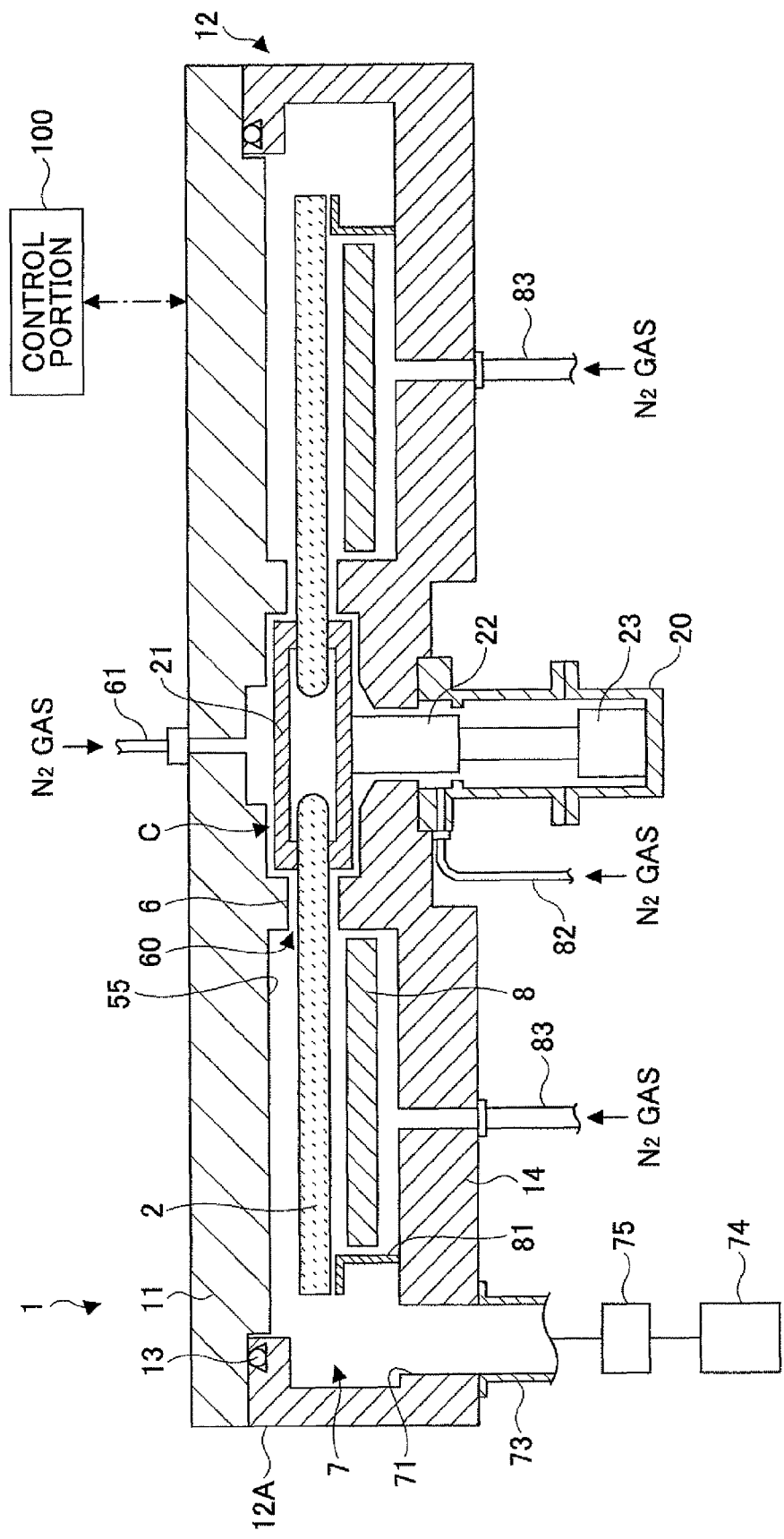
FIG. 1 is a cross-sectional view taken along I-I' line in FIG. 3, illustrating a film deposition apparatus according to an embodiment of the present invention.

According to an embodiment of the present invention, even when a gas concentration of reaction gases supplied to a turntable on which substrates are placed is varied along a radius direction of the turntable, the reaction gases for compensating for the varied gas concentration are supplied from compensation gas nozzles to an area with a lower gas concentration, thereby improving gas concentration uniformity along the radius direction of the turntable. As a result, across substrate uniformity of the film deposited on the substrates can be improved.

Non-limiting, exemplary embodiments of the present invention will now be described with reference to the accompanying drawings. In the drawings, the same or corresponding reference symbols are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

Figure 3:
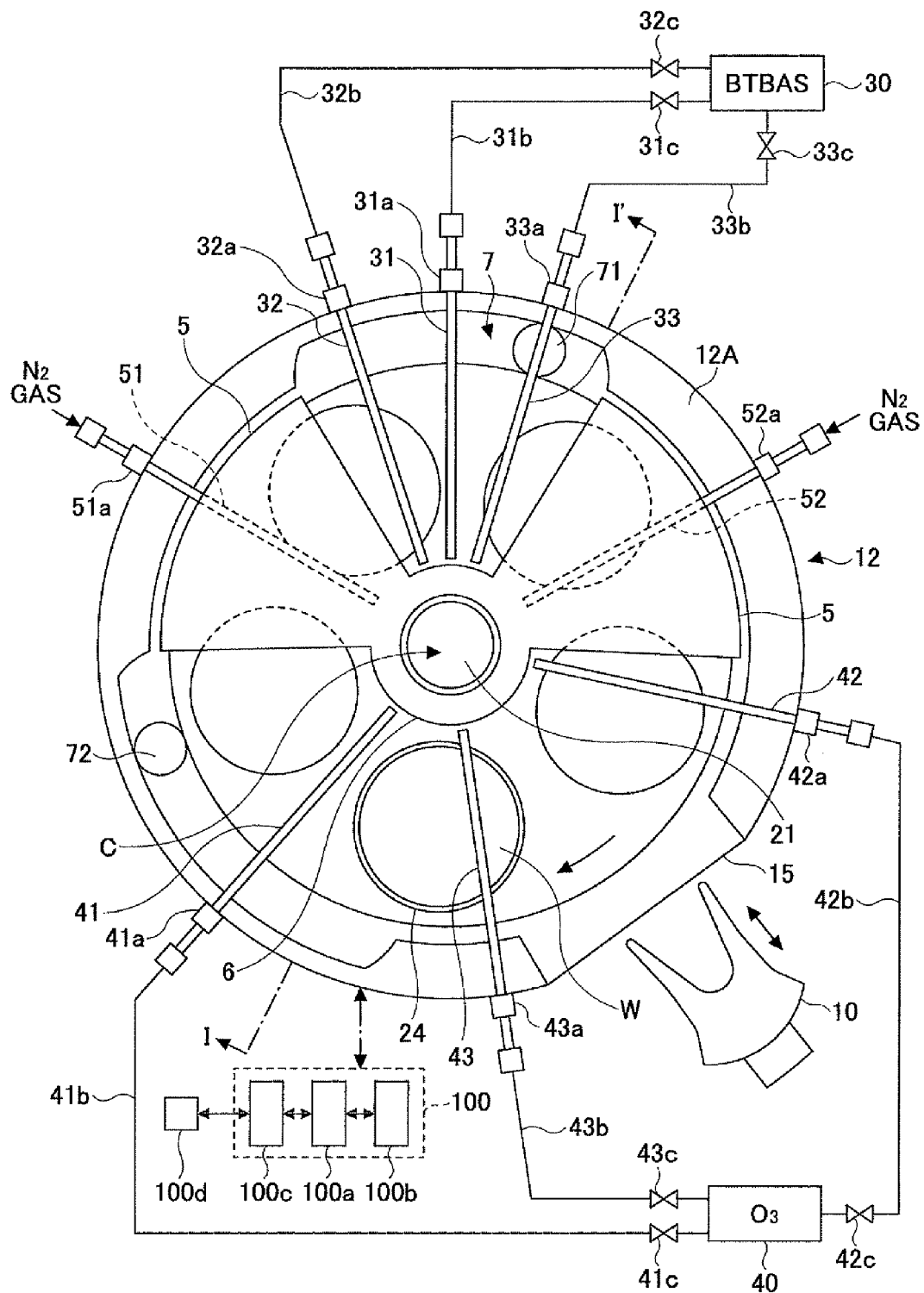
FIG. 3 is a plan view of the film deposition apparatus of FIG. 1.

Referring to FIG. 1, which is a cut-away diagram taken along I-I' line in FIG. 3, a film deposition apparatus according to an embodiment of the present invention has a vacuum chamber 1 having a flattened cylinder shape, and a turntable 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The turntable 2 is rotatably fixed onto a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 is hermetically fixed to a bottom surface of the bottom portion 14 via a flanged pipe portion 20a, which isolates an inner environment of the case body 20 from an outer environment.

Figure 2:
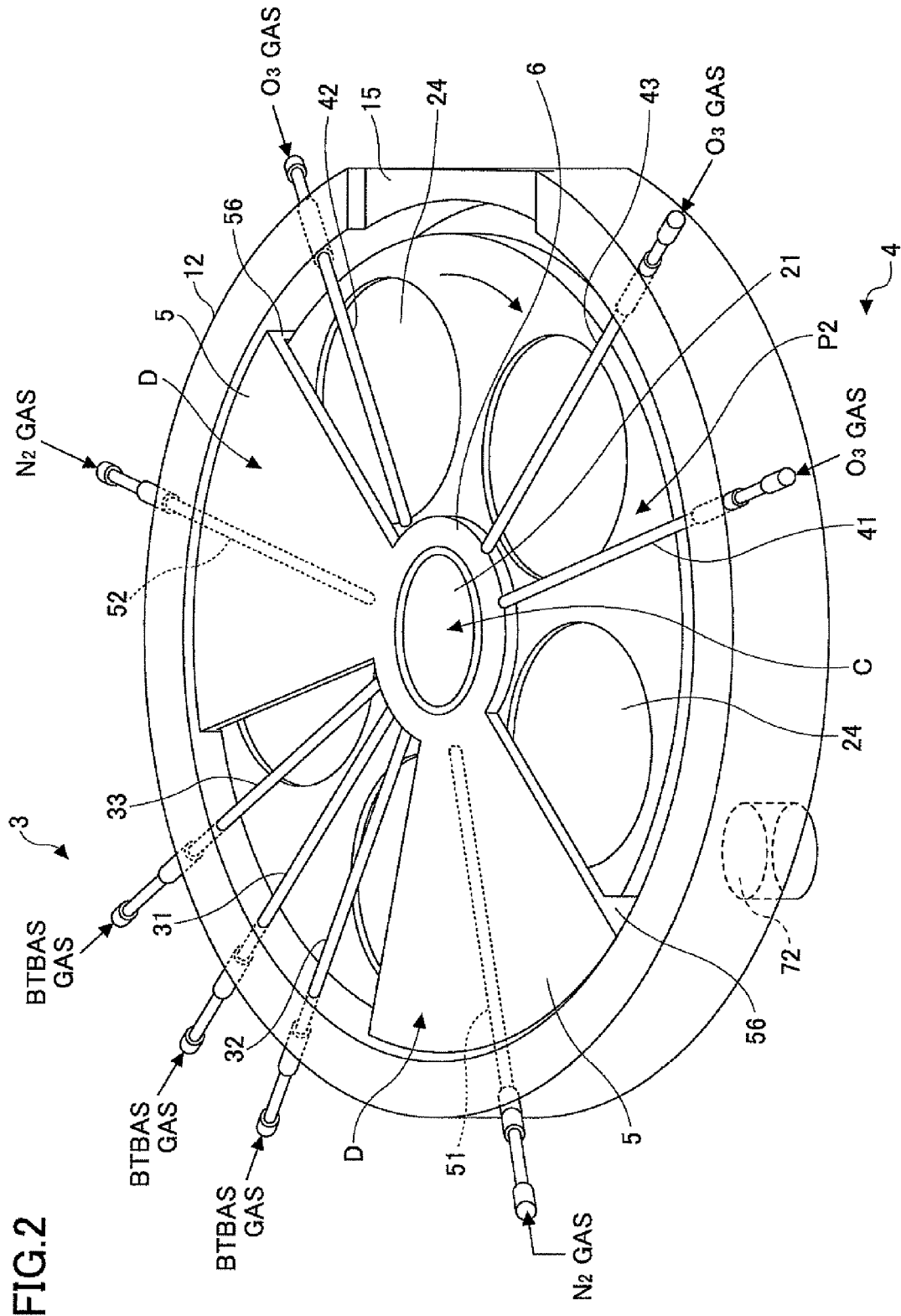
FIG. 2 is a perspective view illustrating an inner configuration of the film deposition apparatus of FIG. 1.

As shown in FIGS. 2 and 3, plural (five in the illustrated example) circular concave portions 24, each of which receives a wafer W, are formed in a top surface of the turntable 2, although only one wafer W is illustrated in FIG. 3. The concave portions 24 are located at equal angular intervals in the turntable 2. FIG. 4A is a projected cross-sectional diagram taken along a circle concentric to the turntable 2 in FIG. 3. As shown in FIG. 4A, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area and the wafer W, a pressure difference is caused by the step.

Therefore, from a viewpoint of excellent thickness uniformity across the wafer W, the two surfaces are preferably at substantially the same elevation. While "the same elevation" may mean here that a height difference is less than or equal to about 5 mm, the difference has to be as close to zero as much as possible to the extent allowed by machining accuracy. In the bottom of the concave portion 24 there are formed three through holes (not shown) through which three corresponding elevation pins (see FIG. 8) are raised/lowered. The elevation pins support a back surface of the wafer W and raises/lowers the wafer W.

The concave portions 24 are wafer W receiving areas provided to position the wafers W and prevent the wafers W from being thrown out by centrifugal force caused by rotation of the turntable 2. However, the wafer W receiving areas are not limited to the concave portions 24, but may be realized by guide members that are located at predetermined angular intervals on the turntable 2 to hold the edges of the wafers W. For example, the wafer W receiving areas may be realized by chuck mechanisms such as electrostatic chucks. When the wafers W are held by the chuck mechanisms, areas where the wafers W are held correspond to the wafer W receiving areas.

As shown in FIGS. 2 and 3, the vacuum chamber 1 is provided with plural gas nozzles extending above the turntable 2 in a radial direction from the center portion of the vacuum chamber 1. The plural gas nozzles are arranged at predetermined angular intervals along a circumferential direction of the vacuum chamber (rotation direction of the turntable 2).

The gas nozzles are categorized into a group 3 of reaction gas nozzles for supplying a first reaction gas, for example, a source gas into the vacuum chamber 1, a group 4 of oxidizing gas nozzles for supplying a second reaction gas, for example, an oxidizing gas into the vacuum chamber 1, and a group of separation gas nozzles for supplying a separation gas into the vacuum chamber 1. The group 3 of the reaction gas nozzles includes three gas nozzles; the group 4 of the oxidizing gas nozzles includes three gas nozzles; and the group of the separation gas nozzles includes separation gas nozzles 51, 52.

Specifically, the group 3 of the reaction gas nozzles includes a first main gas nozzle 31 for supplying the first reaction gas, for example, the source gas to the wafers W placed in the concave portions 24, and, for example, two first compensation gas nozzles 32, 33 for supplying the source gas to the upper surface of the turntable 2 in order to compensate for a nonuniform concentration distribution of the source gas supplied from the first main gas nozzle 31 along a radius direction of the turntable 2. In addition, the group 4 of the oxidizing gas nozzles includes a second main gas nozzle 41 for supplying the second reaction gas, for example, the oxidizing gas to the wafers W placed in the concave portions 24, and, for example, two second compensation gas nozzles 42, 43 for supplying the oxidizing gas to the upper surface of the turntable 2 in order to compensate for a nonuniform concentration distribution of the oxidizing gas supplied from the second main gas nozzle 41 along the radius direction of the turntable 2.

The first main gas nozzle 31, the first compensation gas nozzles 32, 33, the second main gas nozzle 41, the second compensation gas nozzles 42, 43, and the separation gas nozzles 51, 52 are arranged opposing the turntable 2 and extending in the radius direction from a substantial center portion to a circumference of the turntable 2. These gas nozzles are attached at their base end portions to a circumferential wall 12A of the vacuum chamber 1, so that the base end portions, which are gas inlet ports 31a through 33a, 41a through 43a, 51a, 52a, penetrate the circumferential wall 12A.

The gas nozzles 31 through 33, 41 through 43, 51, 52 may be introduced into the vacuum chamber 1 from a protrusion portion 6 (described later) while being introduced into the vacuum chamber 12 through the circumferential wall 12A in the illustrated example. In this case, an L-shaped conduit may be provided in order to be open on the outer circumferential surface of the protrusion portion 6 and on the outer top surface of the ceiling plate 11. With such an L-shaped conduit, the nozzles 31 through 33, (41 through 43, 51, 52) can be connected to one opening of the L-shaped conduit inside the chamber 1 and the gas inlet ports 31 through 33, (41 through 43, 51, 52) can be connected to the other opening of the L-shaped conduit outside the chamber 1.

The first main gas nozzle 31 and the first compensation gas nozzles 32, 33 are connected to a gas supplying source 30 of bis (tertiary-butylamino) silane (BTBAS) gas, which is the source gas (first reaction gas), via supplying lines 31b through 33b including corresponding flow rate controllers 31c through 33c. The second main gas nozzle 41 and the second compensation gas nozzles 42, 43 are connected to a gas supplying source 40 of $O_3$ (ozone) gas, which is the oxidizing gas (second reaction gas), via supplying lines 41b through 43b including corresponding flow rate controllers 41c through 43c. In addition, the separation gas nozzles 51, 52 are connected to a gas supplying source (not shown) of nitrogen ($N_2$) gas, which is the separation gas. In the illustrated example, the group 4 of the oxidizing gas nozzles, the separation gas nozzle 51, the group 3 of the reaction gas nozzles, and the separation gas 52 are arranged clockwise in the this order.

Figure 5:
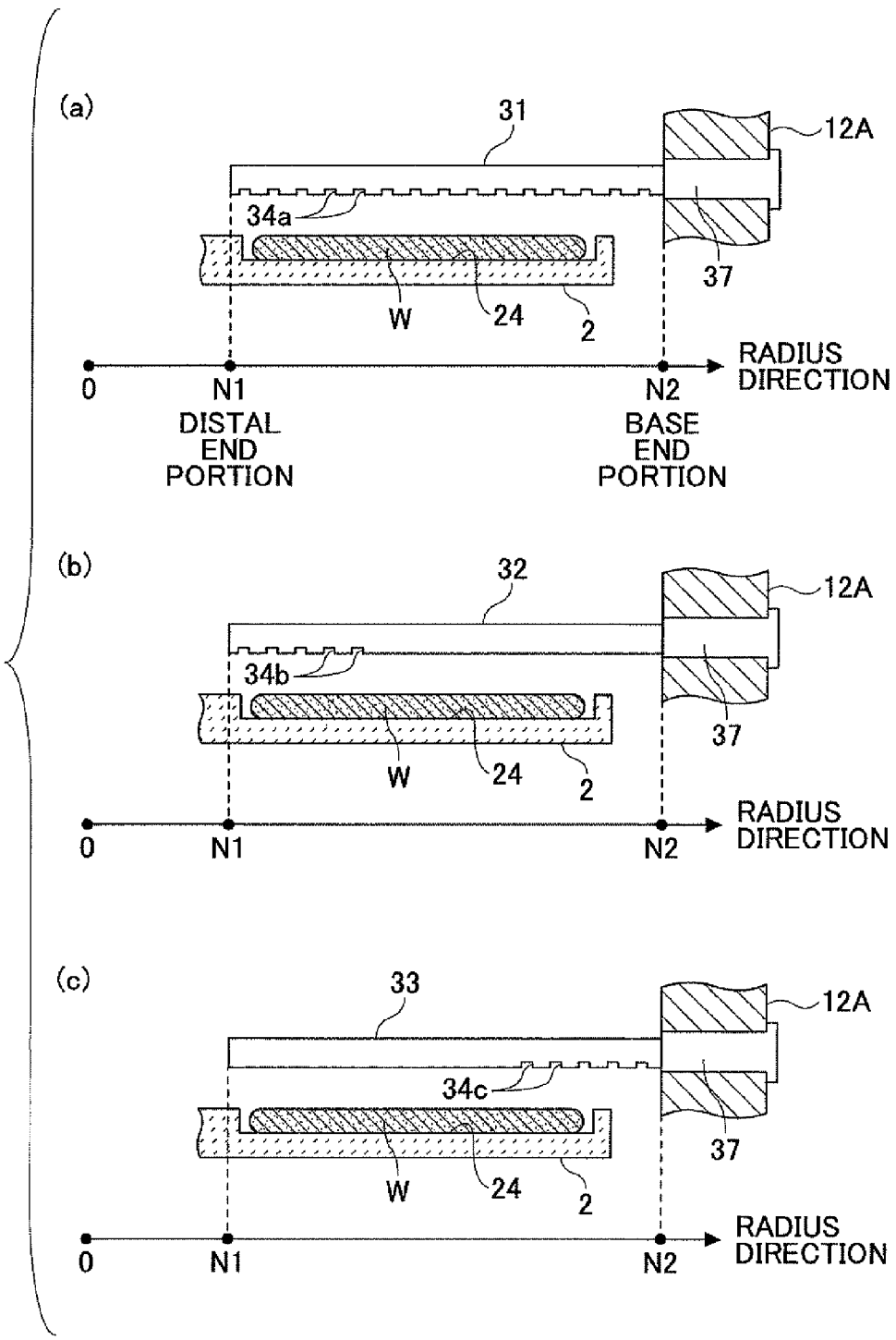
FIG. 5 is a cross-sectional view illustrating an area of a compensation gas nozzle where gas ejection holes are formed.
Figure 6:
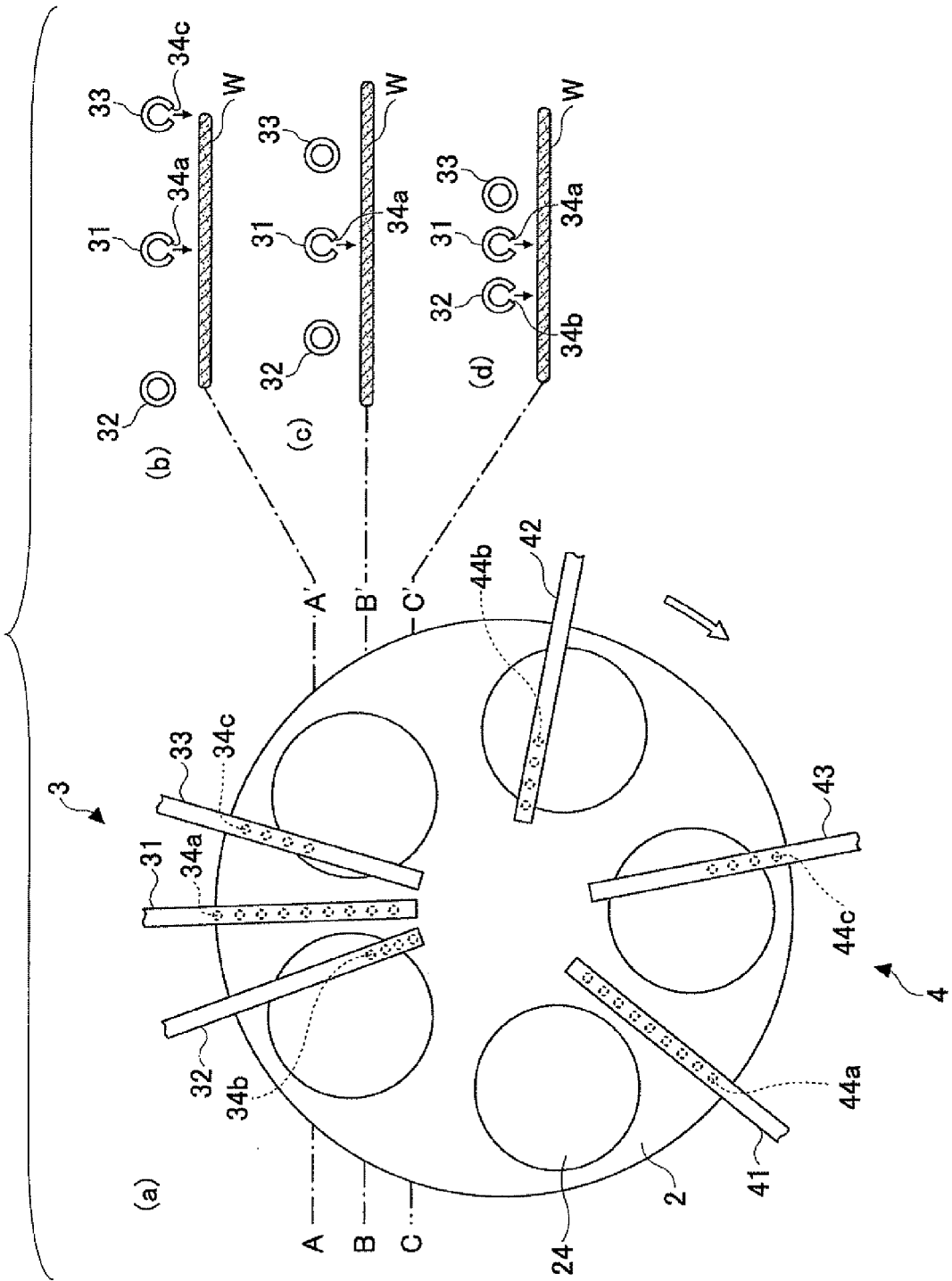
FIG. 6 illustrates a group of source gas nozzles and a group of oxidizing gas nozzles.

The group 3 of the reaction gas nozzles is more specifically explained in the following. As shown in FIGS. 5 and 6, the first main gas nozzle 31 is provided with gas ejection holes 34a for ejecting the source gas downward at predetermined intervals. The gas ejection holes 34a are arranged from a distal end portion N1 through a base end portion $N_2$ (see a subsection (a) of FIG. 5) along a longitudinal direction of the first main gas nozzle 31. The first compensation gas nozzles 32, 33 are arranged in both sides of the first main gas nozzle 31 relative to the rotation direction of the turntable 2 (referred to as a "rotation direction", below), in this embodiment.

An area where gas ejection holes 34b are formed in the first compensation gas nozzle 32 is different from an area where gas ejection holes 34c are formed in the first compensation gas nozzle 33, along the radius direction of the turntable 2. Namely, the first compensation gas nozzle 32 has the gas ejection holes 34b, which eject the source gas downward, in a predetermined range from the distal end portion N1 along a longitudinal direction of the first compensation gas nozzle 32 (the range may be referred to as a distal end area, hereinafter). With such a configuration, the first compensation gas nozzle 32 can supply the source gas in order to compensate for the source gas concentration distribution in and around a rotation center side of the turntable 2. On the other hand, the first compensation gas nozzle 33 has the gas ejection holes 34c, which eject the source gas downward, in a predetermined range from the base end portion $N_2$ along a longitudinal direction of the first compensation gas nozzle 33 (the range may be referred to as a base end area, hereinafter). With such a configuration, the first compensation gas nozzle 33 can supply the source gas in order to compensate for the source gas concentration distribution in and around a circumferential side of the turntable 2.

In the following explanation, the first compensation gas nozzle 32 may be referred to as a first center side compensation gas nozzle 32, and the first compensation gas nozzle 33 may be referred to as a first center side compensation gas nozzle 33. Incidentally, reference symbols 37 represent attachment members for attaching the gas nozzles 31 through 33 in the circumferential wall 12A of the chamber body 12 (FIG. 1).

Similarly, the second main gas nozzle 41 is provided with gas ejection holes 44a for ejecting the oxidizing gas downward at predetermined intervals. The gas ejection holes 44a are arranged along and over a longitudinal direction of the second main gas nozzle 41 (see FIG. 6). The second compensation gas nozzles 42, 43 are arranged upstream of the rotation direction relative to the second main gas nozzle 41 in this embodiment. The second compensation gas nozzle 42 has gas ejection holes 44b arranged in a predetermined range from the distal end portion N1 (the distal end area) along the longitudinal direction of the second compensation gas nozzle 42, which makes it possible to supply the oxidizing gas downward to the center side of the turntable 2. The second compensation gas nozzle 43 has gas ejection holes 44c arranged in a predetermined range from the base end portion $N_2$ (the base end area) along the longitudinal direction of the second compensation gas nozzle 43, which makes it possible to supply the oxidizing gas downward to the circumferential side of the turntable 2. In the following explanation, the second compensation gas nozzle 42 may be referred to as a second center side compensation gas nozzle 42, and the second compensation gas nozzle 43 may be referred to as a second circumferential side compensation gas nozzle 43.

A subsection (a) of FIG. 6 illustrates schematically a horizontal positional relationship among the group 3 of the reaction gas nozzles, the group 4 of the oxidizing gas nozzles, and the turntable 2. Subsections (b) through (d) of FIG. 6 are schematic cross-sectional views taken along A-A' line, B-B' line, and C-C' line of the subsection (a) of FIG. 6, respectively. Specifically, the subsection (b) of FIG. 6 is the schematic cross-sectional view illustrating the group 3 of the reaction gas nozzles in the circumferential side of the turntable 2; the subsection (c) of FIG. 6 is the schematic cross-sectional view illustrating the group 3 of the reaction gas nozzles in the center side of the turntable 2; and the subsection (d) of FIG. 6 is the schematic cross-sectional view illustrating the group 3 of the reaction gas nozzles in a middle area along the radius direction of the turntable 2. As shown, when seen along the radius direction of the turntable 2, the source gas is supplied toward the wafer W from the first main gas nozzle 31 and the first compensation gas nozzle 33 in the circumferential side, from the first main gas nozzle 31 in the middle area, and from the first main gas nozzle 31 and the first compensation gas nozzle 32 in the center side of the turntable 2.

An area below the group 3 of the reaction gas nozzles may be referred to as a first process area P1 where the BTBAS gas is adsorbed on the wafer; and an area below the group 4 of the oxidizing gas nozzles may be referred to as a second process area P2. Positions of the first and the second main gas nozzles 31, 41, the first center side compensation gas nozzle 32, the second center side compensation gas nozzles 42, the first circumferential side compensation gas nozzle 33 and the second circumferential side compensation gas nozzle 43 are arbitrarily determined. In addition, the ranges where the gas ejection holes 33b, 33c, 34b, 34c are arranged in the first and the second center side compensation gas nozzles 32, 42 and the first and the second circumferential side compensation gas nozzles 33, 43 are arbitrarily determined in terms of positions and lengths of the ranges. Moreover, shapes, sizes, and intervals of the gas ejection holes 34a through 34c and 44a through 44c are arbitrarily determined.

The separation gas nozzles 51, 52 serve as separation gas supplying portions, and form separation areas D for separating the first process area P1 and the second process area P2, along with lower surfaces of convex portions 5, namely, flat low ceiling surfaces 54 (first ceiling surfaces). Gas ejection holes 50 for supplying the separation gas downward are formed in the separation gas nozzles 51, 52, and arranged in predetermined intervals along longitudinal directions of the separation gas nozzles 51, 52 (see FIG. 4).

Figure 4:
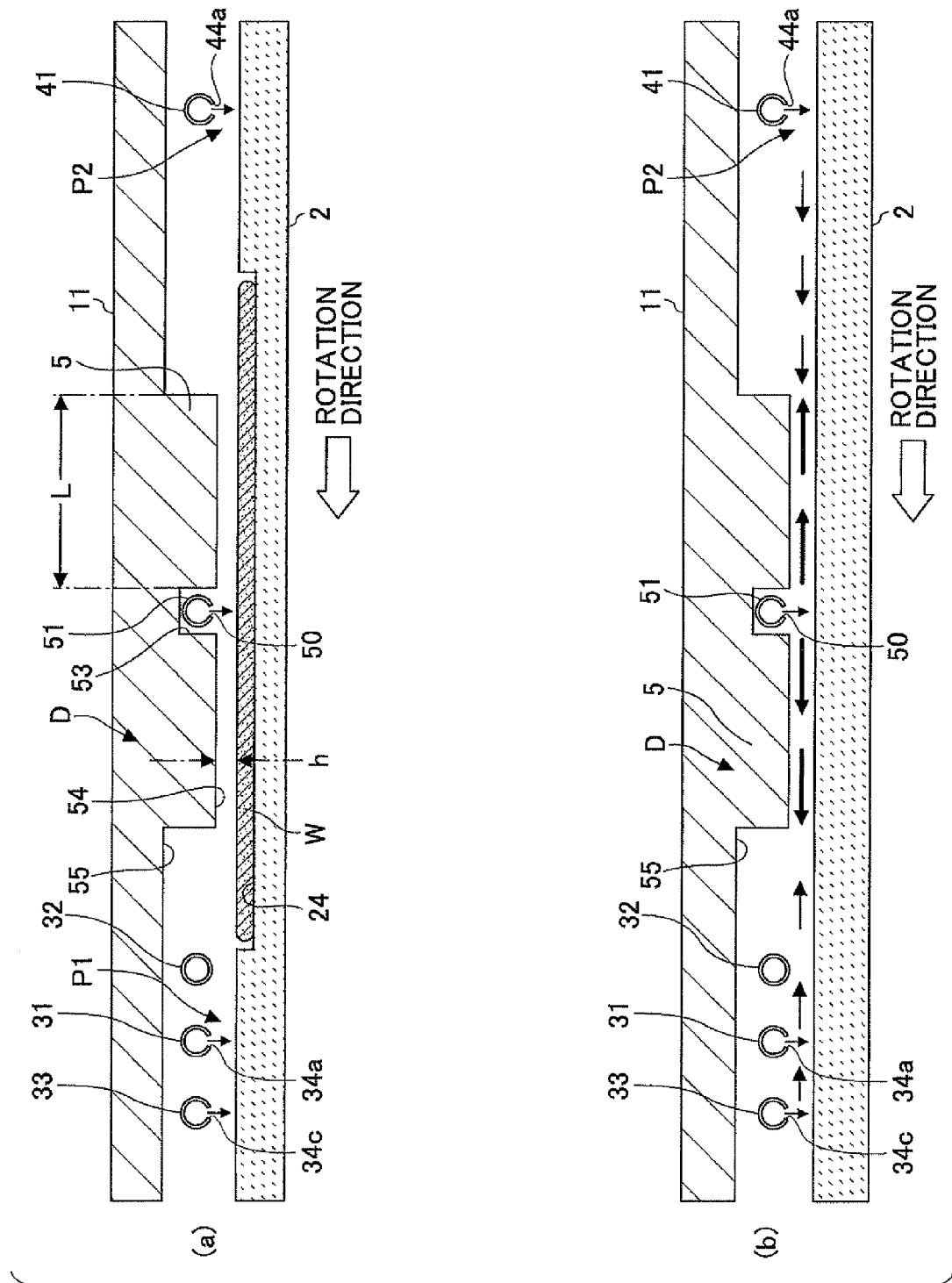
FIG. 4 is a cross-sectional view illustrating process areas and a separation area of the film deposition apparatus of FIG. 1.

In the separation areas D, the corresponding convex portions 5 are provided that have a top view shape of a sector whose apex lies at the center of the chamber 1 and whose arced periphery lies near and along the inner circumferential wall of the chamber body 12 and extends downward, as shown in FIGS. 2 through 4. The separation gas nozzles 51, 52 are accommodated in corresponding groove portions 53 that are formed in order to extend along a radius direction and in the middle of the circumferential direction of the sector. In the illustrated example, a distance between a center axis of the separation gas nozzle 51 (52) and one of straight sides of the convex portion 5 is equal to a distance between a center axis of the separation gas nozzle 51 (52) and the other one of straight sides of the convex portion 5. While the groove portion 53 is formed in order to bisect the convex portion 5 in this embodiment, the groove portion 53 is formed so that an upstream side of the convex portion 5 relative to the rotation direction of the turntable 2 is wider, in other embodiments.

With such configurations, the flat lower ceilings 54 (first ceiling surfaces), which are the lower surfaces of the convex portion 5, exist in both sides of the separation gas nozzle 51 (52) in the circumferential direction of the turntable 2, and ceiling surfaces 55 (second ceiling surfaces) higher than the ceiling surface 54 exist outside of the lower ceilings 54. The convex portion 5 creates a separation space, which is a thin space, with respect to the turntable 2 for impeding the reaction gases, or the source gas and the oxidizing gas in this embodiment from entering the separation space.

With reference to FIG. 4, the separation area D including the separation gas nozzle 51 impedes the $O_3$ gas that flows from the second main gas nozzle 41 located upstream of the rotation direction of the turntable 2 in relation to the separation gas nozzle 51 from entering the separation space below the convex portion 5, and the BTBAS gas that flows from the first main gas nozzle 31 and the first center side compensation gas nozzle 33 from entering the separation space below the convex portion 5. "The gases being impeded from entering" means that the $N_2$ gas as the separation gas ejected from the separation gas nozzle 51 spreads between the first ceiling surfaces 54 and the upper surface of the turntable 2 and flows out to a space below the second ceiling surfaces 55, which are adjacent to the corresponding first ceiling surfaces 54 in the illustrated example, so that the gases cannot enter the separation space from the space below the second ceiling surfaces 55. "The gases cannot enter the separation space" means not only that the gases are completely prevented from entering the separation space, but that the gases cannot proceed farther toward the separation gas nozzle 51 and thus be intermixed with each other even when a fraction of the reaction gases enter the separation space. Namely, as long as such an effect is demonstrated, the separation area D is to separate the first process area P1 and the second process area P2. In addition, a height of the separation space (thin space) is determined so that a pressure in the separation space (a lower space below the convex portion 5 is higher than a pressure in spaces adjacent to the separation spaces (spaces below the second ceiling surface 55 in this embodiment), thereby certainly demonstrating the effect of "the gas being impeded from entering". The specific size of the separation space varies depending of an area of the lower surface of the convex portion 5. Incidentally, the BTBAS gas or the $O_3$ gas adsorbed on the wafer W can pass through below the convex portion 4. Therefore, the gases in "the gases being impeded from entering" mean the gases in a gaseous phase.

Referring to FIGS. 1 and 2, a ring-shaped protrusion portion 6 is provided on a lower surface of the ceiling plate 11 so that an inner circumference of the protrusion portion 6 faces the outer circumference of the core portion 21. The protrusion portion 6 opposes the turntable 2 at an outer area of the core portion 21. In addition, a lower surface of the protrusion portion 6 and a lower surface of the convex portion 5 are at the same elevation. In other words, a height of the lower surface of the protrusion portion 6 from the turntable 2 is the same as a height of the lower surface of the convex portion 5, which will be referred to as a height h below. Incidentally, the convex portion 5 is formed not integrally with but separately from the protrusion portion 6 in other embodiments. FIGS. 2 and 3 illustrate the inner configuration of the chamber 1 whose top plate 11 is removed while the convex portions 4 remain inside the vacuum chamber 1.

When the wafer W having a diameter of about 300 mm is supposed to be processed in the vacuum chamber 1, the convex portion 5 has a circumferential length of, for example, about 146 mm along an arc boundary between the convex portion 5 and the protrusion portion 6 that is at a distance 140 mm from the rotation center of the turntable 2, and a circumferential length of, for example, about 502 mm along an outer arc located corresponding to the outermost portion of the concave portions 24 of the turntable 2 in this embodiment. In addition, a circumferential length from one side wall of the convex portion 4 through the nearest side wall of the groove portion 53 along the outer arc is about 246 mm. In addition, the height h (see the subsection (a) of FIG. 4) of the lower surface of the convex portion 5, namely, the ceiling surface 54 from the upper surface of the turntable 2 may be about 0.5 mm through about 10 mm, for example, and is preferably about 4 mm.

The above dimensions are preferably applicable when the rotation speed of the turntable is set as from about 1 revolution per minute through about 500 rpm. However, the sizes of the convex portions 5 and the height h of the ceiling surface 54 from the upper surface of the turntable 2 may be designed through experimentation.

Moreover, the first and the second main gas nozzles 31, 41, the first compensation gas nozzles 32, 33, the second compensation gas nozzles 42, 43, and the separation gas nozzles 51, 52 have a length of about 400 mm in the vacuum chamber 1. The gas ejection holes 34a through 34c, 44a through 44c, 50, 50 in the corresponding gas nozzles 31 through 33, 41 through 43, 51, 52 may have an opening diameter of about 0.5 mm, for example, and are arranged at intervals of about 10 mm, for example, along the longitudinal directions of the gas nozzles 31 through 33, 41 through 43, 51, 52. In addition, the ranges where the gas ejection holes 34a, 44a are formed in the corresponding first and second center side compensation gas nozzles 32, 42 may have a length of about 100 mm, for example, from the distal end portions N1 (FIG. 5). Moreover, the ranges where the gas ejection holes 34c, 44c are formed in the corresponding first and second circumferential side compensation gas nozzles 33, 43 may have a length of about 100 mm, for example, from the base end portions N1 (FIG. 5). Incidentally, the $N_2$ gas is used as the separation gas in this embodiment, but $H_2$ gas or an inert gas such as Ar gas may be used in other embodiments, as long as the separation gas does not affect the deposition of silicon oxide.

Figure 7:
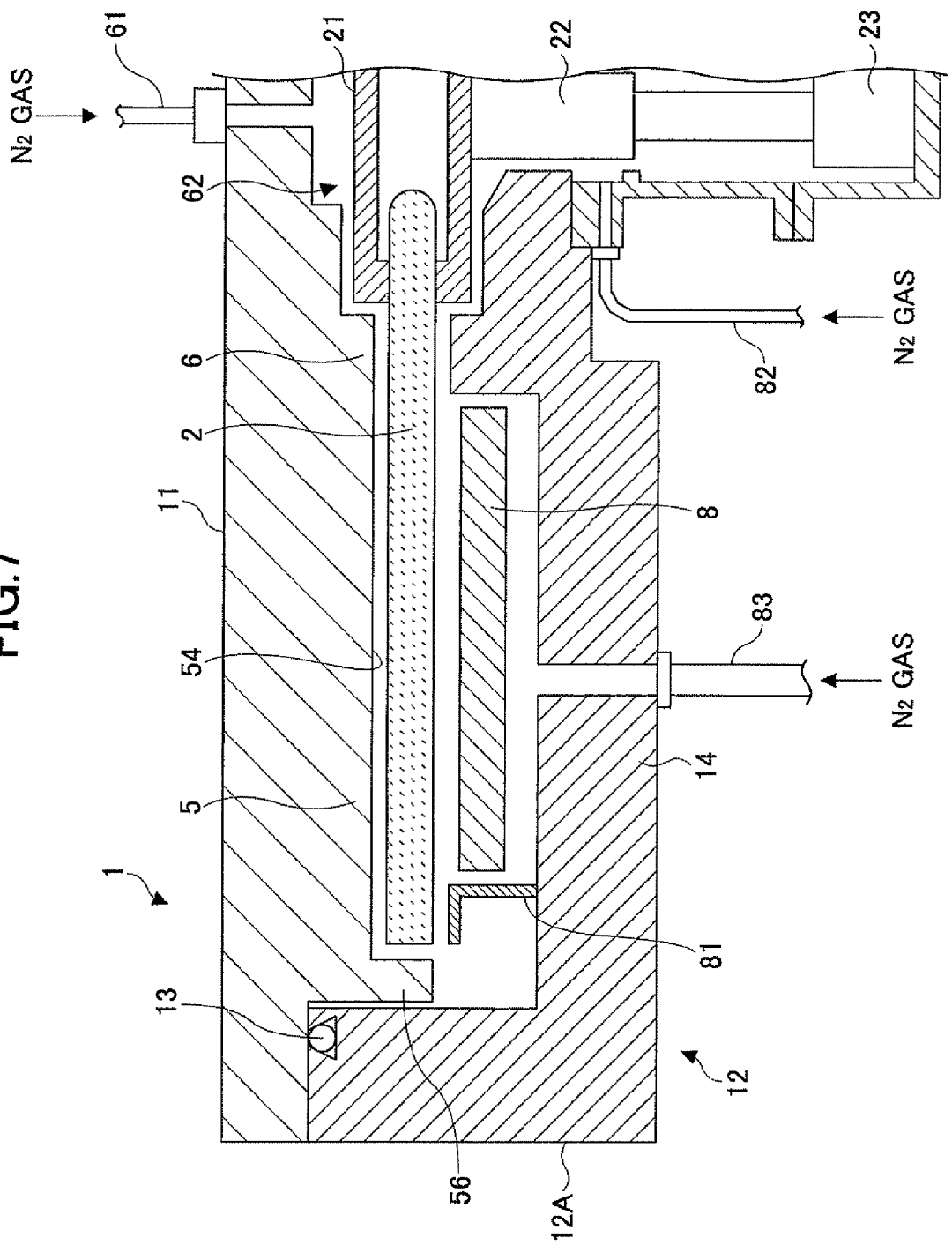
FIG. 7 is a cross-sectional view illustrating a part of the film deposition apparatus of FIG. 1.

As described above, the first ceiling surface 54 (the lower surface of the convex portion 5) and the second surface 55 (the lower surface of the ceiling plate 11) higher than the first ceiling surface 54 exist alternately along the circumferential direction. FIG. 7 shows a half portion of a cross-sectional view of the vacuum chamber 1, where the convex portion 5 is shown. Referring to FIG. 7, the convex portion 5 has a bent portion 56 that bends in an L-shape at the outer circumferential edge of the convex portion 5. There are slight gaps between the bent portion 56 and the turntable 2 and between the bent portion 56 and the chamber body 12 because the convex portion 5 is attached on the back surface of the ceiling plate 11 and removed from the chamber body 12 along with the ceiling plate 11. The bent portion 56 is provided in order to substantially prevent the source gas and the oxidizing gas from being intermixed. The gaps between the bent portion 56 and the turntable 2 and between the bent portion 56 and the chamber body 12 are the same as the height h of the ceiling surface 54 from the turntable 2 in this embodiment. In the illustrated example, an inner circumferential surface of the bent portion 56 serves as an inner circumferential wall of the vacuum chamber 1, when seen from the turntable 2.

While the circumferential wall 12A of the vacuum body 12 has a vertical surface closely opposing the outer circumferential surface of the bent portion 56 in the separation area D, the circumferential wall 12A has an indented portion in areas excluding the separation area D. The indented portion vertically extends from the bottom portion 14 of the chamber body 12 through a level substantially corresponding to the turntable 2. The indented portion is referred to as an evacuation area 6 hereinafter. Below the evacuation area 71, there is an evacuation port 71 (see FIG. 3 for another evacuation port 72) which is connected to an evacuation portion as a vacuum pump 74 via an evacuation pipe 73, which can also be used for the evacuation port 62. Incidentally, a reference symbol 75 in FIG. 1 represents a pressure controller. Plural pressure controllers 75 may be provided to the corresponding evacuation ports 71, 72, or the pressure controller 75 may be used in common for evacuation ports 71, 72. The evacuation ports 71, 72 are located in both sides of the separation areas D, when viewed from above, in order to exclusively evacuate the corresponding gases, thereby causing the separation effect to be certainly demonstrated by the separation areas D. In the illustrated example, the evacuation port 71 is provided between the first main gas nozzle 31 and the separation area D located downstream relative to the first main gas nozzle 31 in relation to the rotation direction; and the evacuation port 72 is provided between the second main gas nozzle 41 and the separation area D located downstream relative to the second main gas nozzle 41 in relation to the rotation direction.

Although the two evacuation ports 71, 72 are made in the chamber body 12 in this embodiment, three evacuation ports may be provided in other embodiments. For example, an additional evacuation port may be made in an area between the second main gas nozzle 41 and the separation area located upstream relative to the rotation direction in relation to the second main gas nozzle 41. In addition, a further additional evacuation port (four evacuation ports in total) may be made in the chamber body 12. While the evacuation ports 71, 72 are located lower than the turntable 2 to evacuate the vacuum chamber 1 through an area between the inner circumferential surface of the chamber body 12 and the outer circumferential surface of the turntable 2 in the illustrated example, the evacuation ports may be located in the circumferential wall 12A of the chamber body 12. In addition, when the evacuation ports 71, 72 are provided in the circumferential wall 12A of the chamber body 12, the evacuation ports 71, 72 may be located higher than the turntable 2. In this case, the gases flow along the upper surface of the turntable 2 into the evacuation ports 71, 72 located higher the turntable 2. Therefore, it is advantageous in that particles in the vacuum chamber 1 are not blown upward by the gases, compared to when the evacuation ports are provided, for example, in the ceiling plate 11.

As shown in FIGS. 1, and 7, a heater unit 8 serving as a heating portion is provided in a space between the bottom portion 14 of the chamber body 12 and the turntable 2, so that the wafers W placed on the turntable 2 are heated through the turntable 2 at a temperature determined by a process recipe. In addition, a cover member 81 is provided beneath the turntable 2 and near the outer circumference of the turntable 2 in order that the space where the heater unit 8 is located (heater unit housing space) is partitioned from the outside area of the cover member 81. The cover member 81 has a flange portion having a predetermined width at the top. The flange portion is arranged so that a slight gap is maintained between the lower surface of the turntable 2 and the flange portion in order to substantially prevent gas from flowing into the heater unit housing space.

Figure 8:
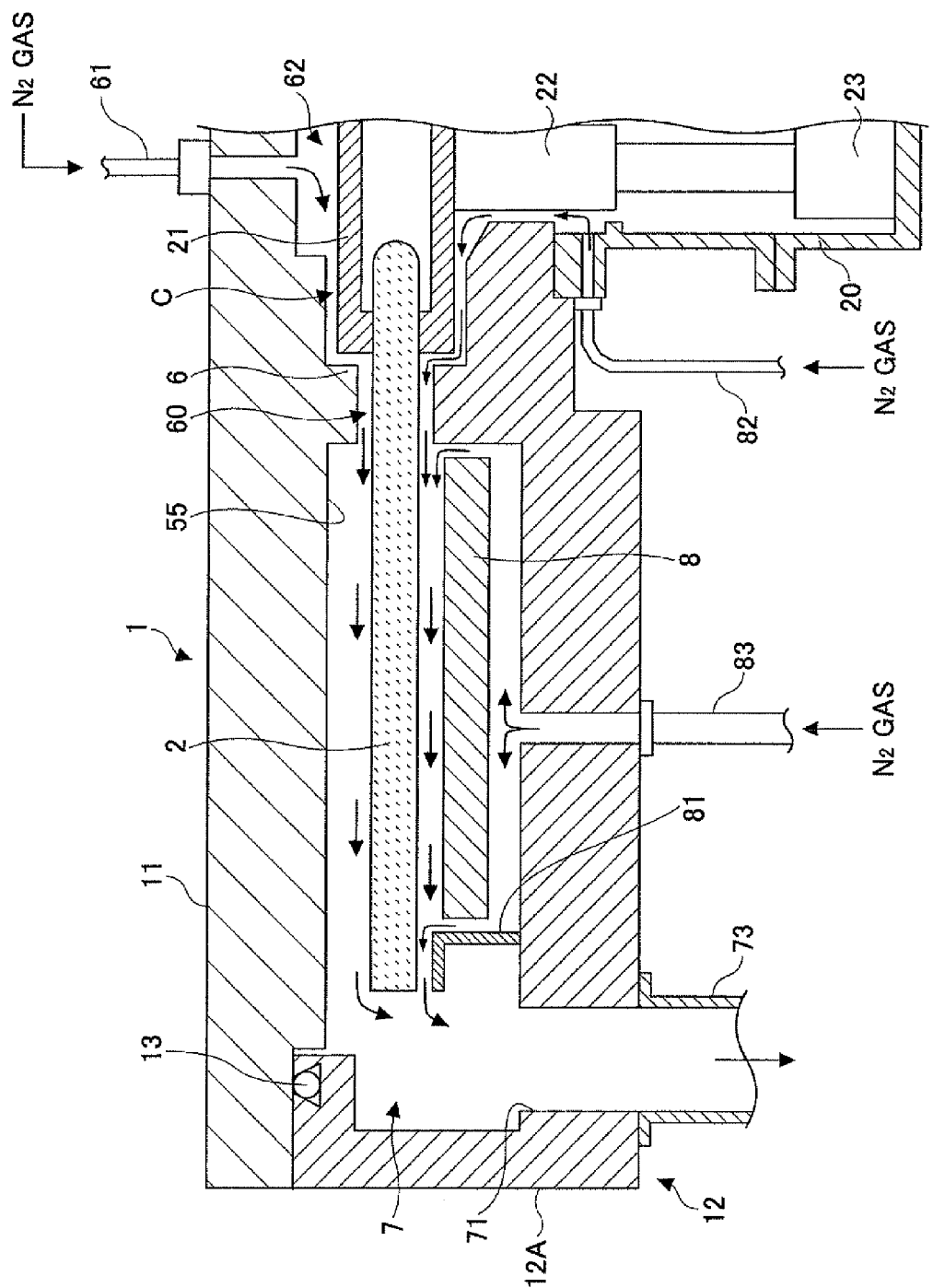
FIG. 8 is an explanatory view illustrating flow patterns of a separation gas and a purge gas.

Referring to FIG. 8, the bottom portion 14 of the chamber body 12 has a raised portion R in a vicinity of the rotation center of the turntable 2. The top surface of the raised portion R comes close to the lower surface of the turntable 2 and the core portion 21, leaving small spaces between the raised portion R and the lower surface of the turntable 2 and between the raised portion R and the lower surface of the core portion 21. In addition, the bottom portion 14 has a center hole through which the rotational shaft 22 passes. The inner diameter of the center hole is slightly larger than the diameter of the rotational shaft 22, leaving a slight gap therebetween. This slight gap and the small spaces allow gaseous communication between the vacuum chamber 1 and the case body 20. A purge gas supplying pipe 82 is connected to an upper portion of the flanged pipe portion 20a. In addition, plural purge gas supplying pipes 83 are connected at predetermined angular intervals to an area below the heater unit 8 in order to purge the space where the heater unit 8 (heater unit housing space) is housed.

By providing the purge gas supplying pipes 82, 83, a space from the case body 20 through the heater unit housing space is purged with $N_2$ purge gas, which in turn flows into the evacuation area 7 through the gap between the turntable 2 and the cover member 81 and is evacuated through the evacuation ports 71, 72, as illustrated by arrows in FIG. 8. With this, the BTBAS gas (or the $O_3$ gas) is substantially prevented from flowing into the second process area P2 (or the first process area P1). Namely, the $N_2$ purge gas serves as a separation gas.

Referring to FIG. 8, a separation gas supplying pipe 61 is connected to the top center portion of the ceiling plate 11 of the vacuum chamber 1, so that $N_2$ gas is supplied as a separation gas to a space 62 between the ceiling plate 11 and the core portion 21. The separation gas supplied to the space 62 flows through a thin gap 60 between the protrusion portion 6 and the turntable 2 and then along the upper surface of the turntable 2. Because the space 62 and the gap 60 are filled with the $N_2$ gas, the reaction gases (BTBAS, $O_3$) cannot be intermixed through the center portion of the turntable 2. In other words, the film deposition apparatus according to this embodiment is provided with a center area C that is defined by the center portion of the turntable 2 and the vacuum chamber 1 in order to separate the first process area P1 and the second process area P2 and is configured to have an ejection opening that ejects the separation gas toward the upper surface of the turntable 2. The ejection opening corresponds to the gap 60 between the protrusion portion 6 and the turntable 2, in the illustrated example.

Figure 9:
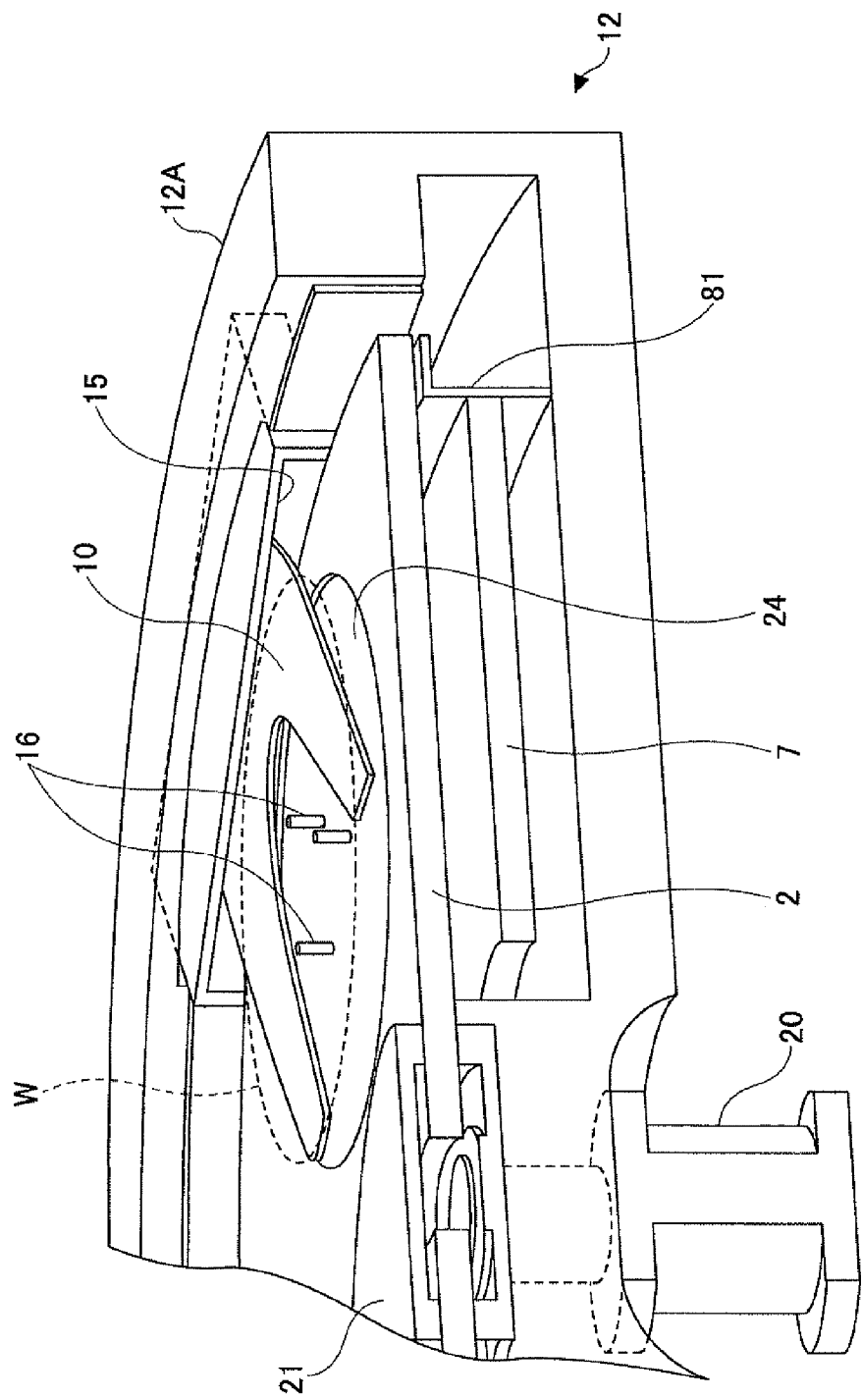
FIG. 9 is a broken perspective view of the film deposition apparatus of FIG. 1.

In addition, a transfer opening 15 is formed in the circumferential wall 12A of the chamber body 12 as shown in FIGS. 2, 3 and 9. Through the transfer opening 15, the wafer W is transferred into/out from the vacuum chamber 1 by a transfer arm 10 (FIGS. 3 and 9). The transfer opening 15 is provided with a gate valve (not shown) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 as a wafer receiving portion of the turntable 2 from the transfer arm 10. In order to lower/raise the wafer W onto/from the concave portion 24, there are provided elevation pins 16 that are raised or lowered through corresponding through holes formed in the concave portion 24 of the turntable 2 by an elevation mechanism (not shown).

In addition, the film deposition apparatus according to this embodiment is provided with a control portion 100 that controls total operations of the deposition apparatus. The control portion 100 includes a process controller 100a composed of, for example, a computer, a user interface portion 100b, and a memory device 100c. The user interface portion 100b has a display that shows operations of the film deposition apparatus, and an input/output (I/O) device including a key board and a touch panel that allows an operator of the film deposition apparatus to select a process recipe and an administrator of the film deposition apparatus to change parameters in the process recipe.

The memory device 100c stores a control program and a process recipe that cause the controlling portion 100 to carry out various operations of the deposition apparatus, and various parameters in the process recipe. These programs have groups of steps for carrying out the operations (film deposition method) described later, for example. These programs are installed into the process controller 100a by instructions from the user interface portion 100b, and run by the process controller 100a. In addition, the programs are stored in a computer readable storage medium 100d and installed into the memory device 100c from the storage medium 100d through an input/output (I/O) device (not shown) corresponding to a type of the computer readable storage medium. The computer readable storage medium 100d may be a hard disk, a compact disc, a magneto optical disk, a memory card, a floppy disk, or the like. Moreover, the programs may be downloaded to the memory device 100c through a communications network.

Next, effects and advantages of this embodiment of the present invention are explained. When a target thickness and/or process conditions such as an inner pressure of the vacuum chamber 1 during film deposition and a rotation speed of the turntable 2 are changed, first, a compensation gas nozzles) to be used among the first compensation gas nozzles 32, 33 and the second compensation gas nozzles 42, 43 for film deposition with the changed target thickness and/or process conditions are selected, and flow rates of the source gas and/or the oxidizing gas for compensating for the nonuniform gas concentration distributions from the selected compensation gas nozzle(s) are determined. For this purpose, a silicon oxide film is deposited on the wafer W by supplying the source gas from the first main gas nozzle 31 and the oxidizing gas from the second main gas nozzle 41, and then a thickness distribution of the film deposited on the wafer W is measured. Next, based on the obtained thickness distribution, a first compensation gas nozzle(s) to be used is selected from the first compensation gas nozzles 32, 33, and the flow rate(s) of the source gas for compensation from the selected first compensation gas nozzle(s) are determined.

Figure 10:
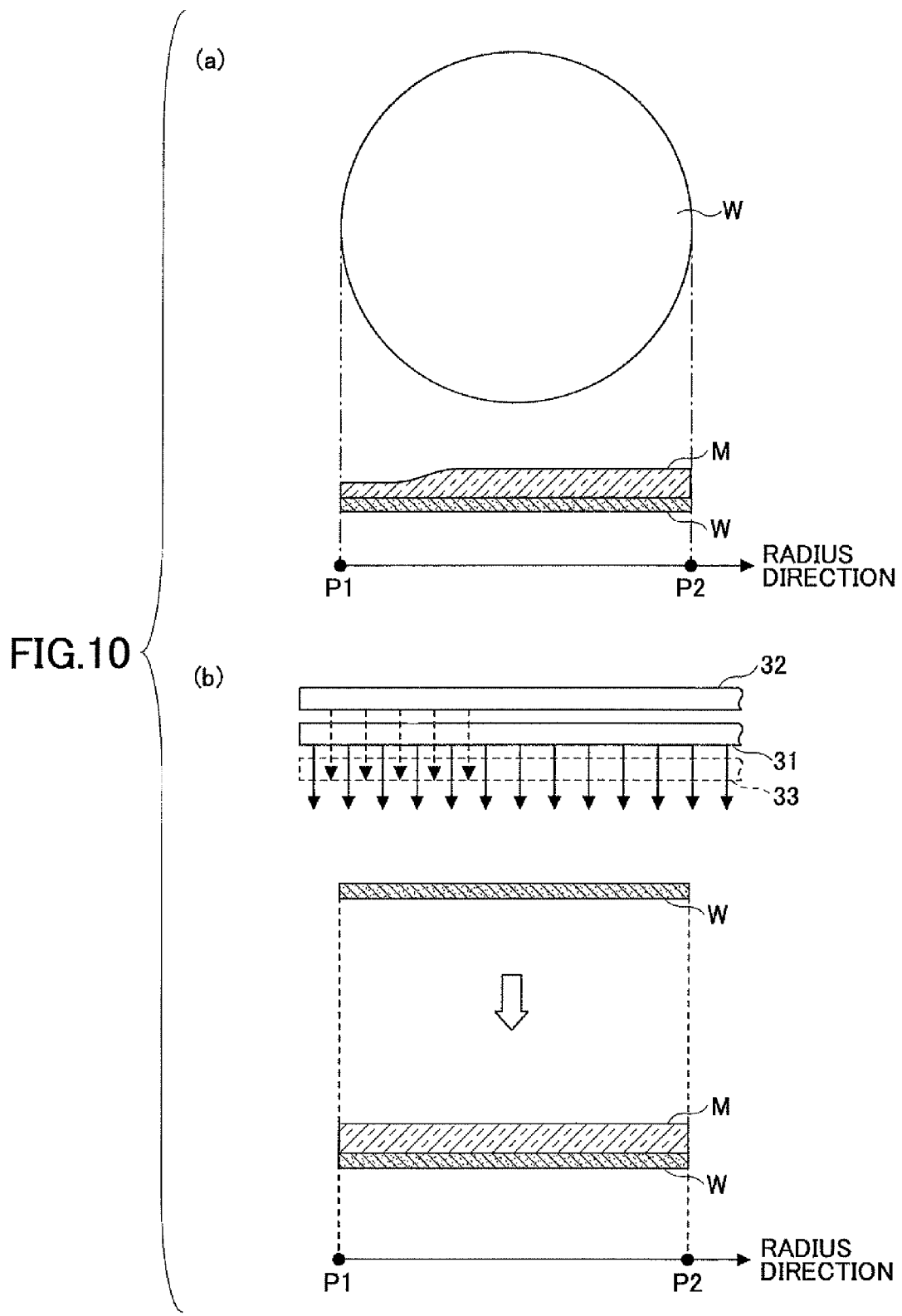
FIG. 10 is an explanatory view illustrating a relationship between a thickness of a film deposited on a substrate and the area of the compensation gas nozzle where the gas ejection holes are formed.
Figure 11:
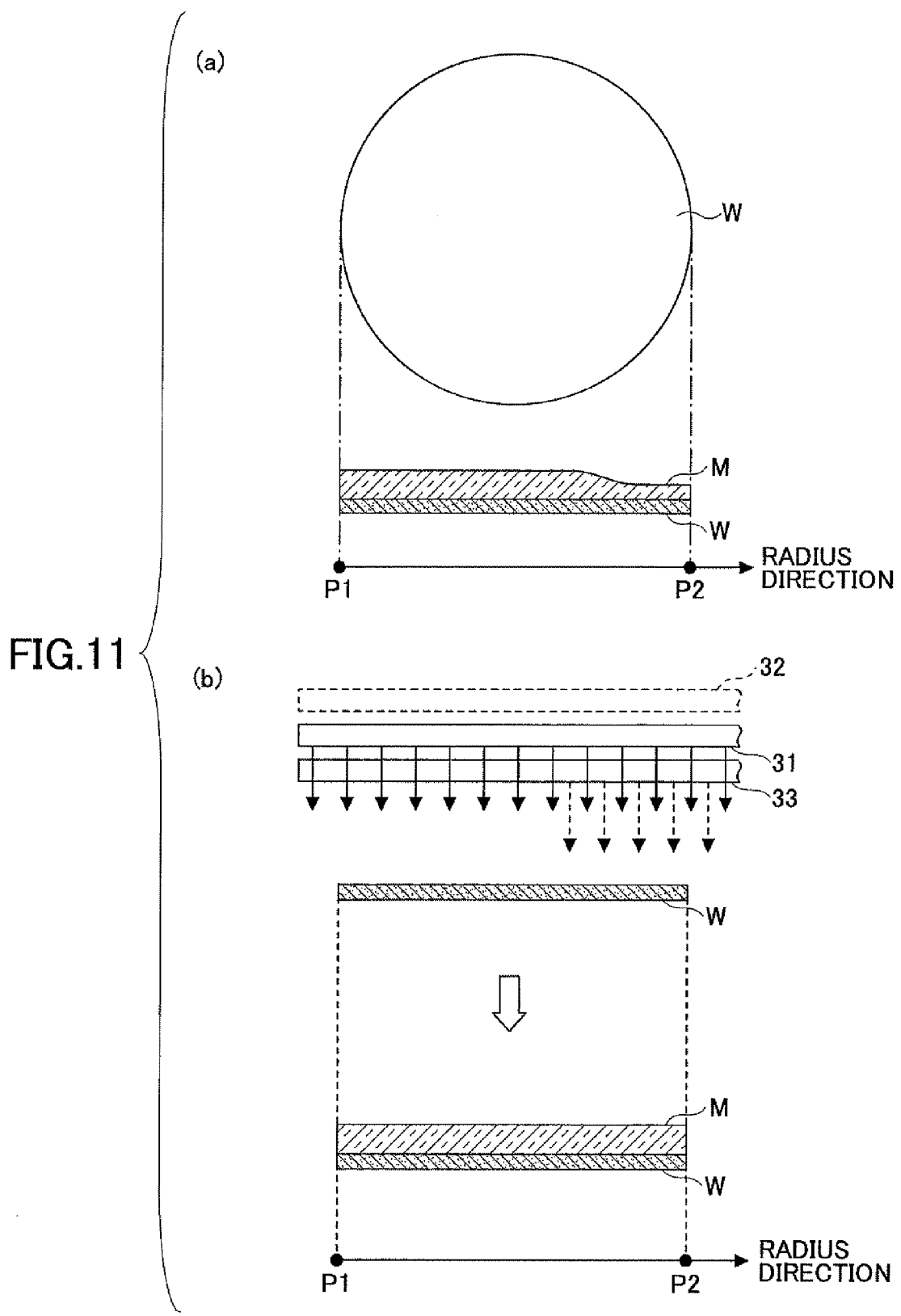
FIG. 11 is another explanatory view illustrating a relationship between a thickness of a film deposited on a substrate and the area of the compensation gas nozzle where the gas ejection holes are formed.

With reference to FIGS. 10 and 11, such procedures are specifically explained. Subsections (a) of FIGS. 10 and 11 illustrate a film thickness distribution of a film M deposited on the wafer W along the radius direction of the turntable 2. In the drawings, points P1 are positioned in the center side of the turntable 2 (or near the distal end portion of the first main gas nozzle 31, and points P2 are positioned in the circumferential side of the turntable 2 (or near the base end portion of the first main gas nozzle 31). As shown, the thickness of the film M is thinner in the center side of the turntable than in the circumferential side of the turntable 2 in the subsection (a) of FIG. 10, and thicker in the center side of the turntable 2 than in the circumferential side of the turntable 2 in the subsection (a) of FIG. 11.

When a film is thinner in the center side than in the circumferential side as shown in the subsection (a) of FIG. 10, the reaction gas concentration is lower in the center side in the process chamber 1. Therefore, the reaction gas is supplied from the first center side compensation gas nozzle 32 whose ejection holes 34b are formed in the distal end area in order to compensate for the reaction gas concentration in the center side. In this case, a flow rate of the reaction gas for compensation from the first center side compensation gas nozzle 32 is determined so that the reaction gas concentration along a radius direction of the turntable 2 becomes uniform.

As a result, the concentration of the reaction gas supplied from the first main gas nozzle 31 and the first center side compensation gas nozzle 32 becomes uniform along the radius direction of the turntable 2, and the film M having an improved thickness uniformity along the radius direction can be obtained, as shown in a subsection (b) of FIG. 10. Incidentally, the first main gas nozzle 31, the first center side compensation gas nozzle 32, and the first circumferential side compensation gas nozzle 33 are vertically illustrated in the subsection s (a) and (b) of FIG. 10, for the sake of simplicity.

In addition, when a film is thinner in the circumferential side than in the center side as shown in the subsection (a) of FIG. 11, the reaction gas concentration is lower in the circumferential side in the process chamber 1. Therefore, the reaction gas is supplied from the first circumferential side compensation gas nozzle 33 whose ejection holes 34c are formed in the base end area in order to compensate for the reaction gas concentration in the circumferential side. In this case, a flow rate of the reaction gas for compensation from the first circumferential side compensation gas nozzle 33 is determined so that the reaction gas concentration along a radius direction of the turntable 2 becomes uniform.

As a result, the concentration of the reaction gas supplied from the first main gas nozzle 31 and the first circumferential side compensation gas nozzle 33 becomes uniform along the radius direction of the turntable 2, and the film M having an improved thickness uniformity along the radius direction can be obtained, as shown in a subsection (b) of FIG. 11.

Moreover, when a film is thicker in a middle area than in the rotation center side and the circumferential side, the first center side compensation gas nozzle 32 and the first circumferential side compensation gas nozzle 33 are used.

The above explanation is applicable to the second compensation gas nozzles 42, 43. Namely, when a gas concentration of the oxidizing gas becomes varied along the radius direction, the BTBAS gas as the reaction gas is likely to be unevenly oxidized, which leads to degraded property uniformity across the wafer W. Therefore, a property (such as a dielectric constant) distribution in the film is measured, and the gas concentration of the $O_3$ gas as the oxidizing gas along the radius direction of the turntable 2 is estimated based on the measured property distribution. Then, based on the estimated concentration distribution, a second compensation gas nozzle(s) to be used is selected from the second compensation gas nozzles 42, 43, and the flow rate(s) of the oxidizing gas for compensation from the selected first compensation gas nozzle(s) are determined.

Next, a film deposition method carried out using the film deposition apparatus according to this embodiment of the present invention is explained. In the following explanation, the first center side compensation gas nozzle 32, the first circumferential side compensation gas nozzle 33, the second center side compensation gas nozzle 42, and the second circumferential side compensation gas nozzle 43 are used as the compensation gas nozzles. First, a gate valve (not shown) is opened; the wafer W is transferred into the vacuum chamber 1 through the transfer opening 15 by the transfer arm 10; and the wafer W is held above the concave portion 24 of the turntable 2 positioned in alignment with the transfer opening 15. As shown in FIG. 9, the lift pins 16 are brought upward to receive the wafer W from the transfer arm 10, and downward after the transfer arm 10 recedes from the vacuum chamber 1, according to which the wafer W is placed in the convex portion 24.

The above procedures are repeated four times by intermittently rotating the turntable 2, thereby placing five wafers W in the corresponding convex portions 24. Next, the separation gas is supplied to the vacuum chamber 1 from the separation gas nozzles 51, 52; the $N_2$ gas is supplied to the vacuum chamber 1 from the separation gas supplying pipe 61; and the vacuum chamber 1 is evacuated to a predetermined pressure. In addition, the turntable 2 is rotated clockwise seen from above, and the wafers W are heated by the heater unit 8. Specifically, the turntable 2 is heated to about 300° C. in advance by the heater unit 8, and the wafers W are heated by placing on the turntable 2. After the wafers W are heated to the set temperature, the $O_3$ gas is supplied from the second main gas nozzle 41, the second compensation gas nozzle 42, and the second circumferential side compensation gas nozzle 43; the BTBAS gas is supplied from the first main gas nozzle 31, the first center side compensation gas nozzle 32, and the first circumferential side compensation gas nozzle 33.

Because the wafers W alternately pass through the first process area P1 and the second process area P2 by the rotation of the turntable 2, the BTBAS gas is adsorbed on the wafers W, and the $O_3$ gas is adsorbed on the wafers W, thereby oxidizing the BTBAS gas is oxidized by the $O_3$ gas. Therefore, one or more layers of silicon oxide are formed per one rotation of the turntable 2, and the silicon oxide film is deposited on the wafers W after a predetermined numbers of the rotations.

Incidentally, because the $N_2$ gas is supplied to the vacuum chamber 1 from the separation gas supplying pipe 61, the $N_2$ gas is ejected from the center area C, in other words, the gap 60 between the protrusion portion 6 and the turntable 2 along the upper surface of the turntable 2. In this embodiment, because the evacuation areas 7 are formed where the inner circumferential surface of the chamber body 12 is indented and the evacuation ports 71, 72 are positioned below the evacuation areas 7, pressures in the spaces where the group 3 of the reaction gas nozzles and the group 4 of the oxidizing gas nozzles are respectively arranged below the second ceiling surfaces 55 become lower than pressures in the thin space below the first ceiling surface 54. In addition, the height h of the first ceiling surface 54 and the protrusion portion 6 from the turntable 2 is designed so that such pressure differences are caused.

Figure 12:
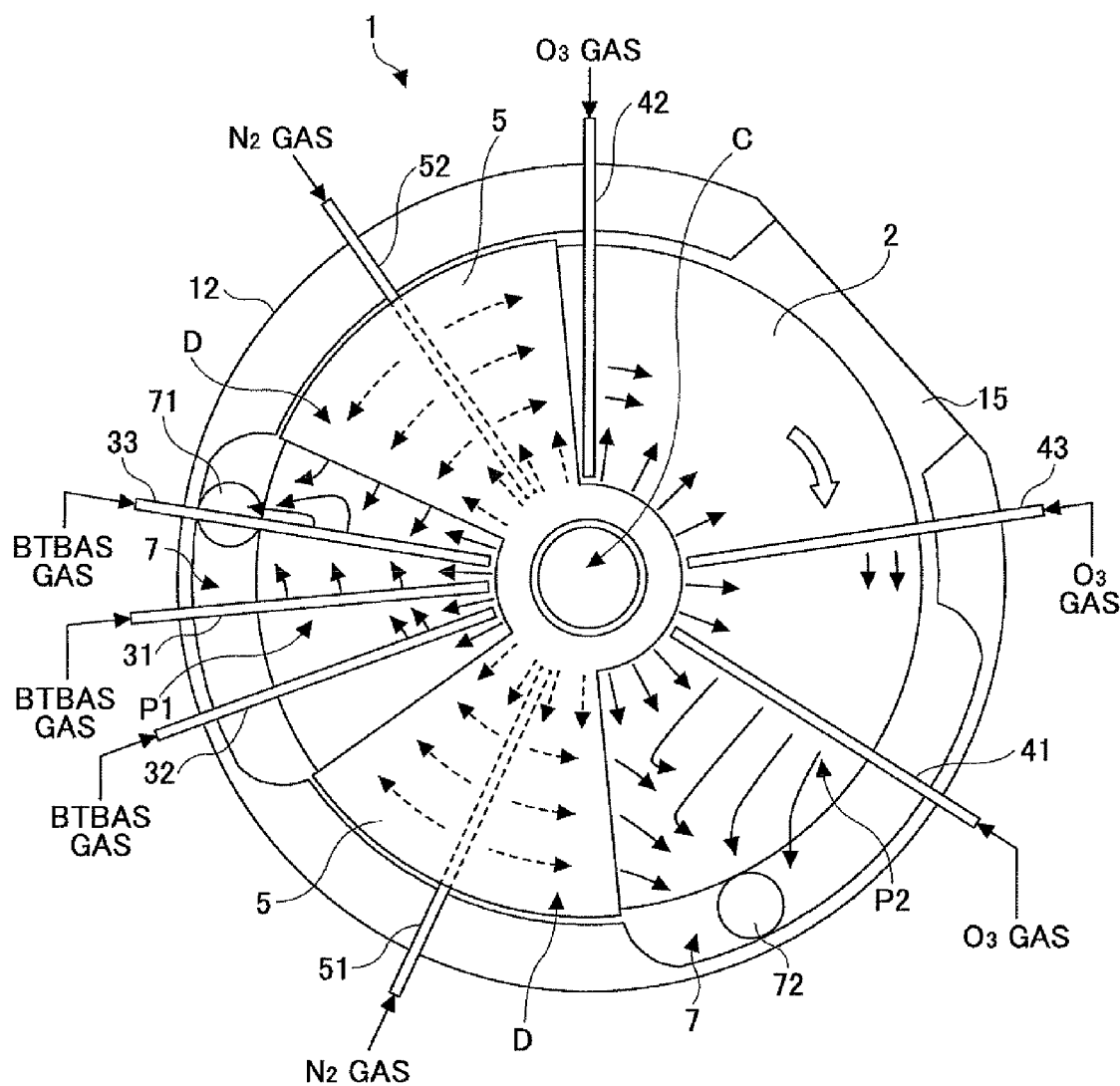
FIG. 12 is an explanatory view illustrating that a source gas and an oxidizing gas are separated by a separation gas and evacuated.

Next, the flow patterns of the gases in the vacuum chamber 1 during the film deposition are explained in reference to FIG. 12, where the flow patterns are schematically illustrated. As shown, part of the $O_3$ gas ejected from the second main gas nozzle 31, the first center side compensation gas nozzle 32, and the first circumferential side compensation gas nozzle 33 hits and flows along the upper surface of the turntable 2 (and the surface of the wafer W) in a direction opposite to the rotation direction of the turntable 2. Then, the $O_3$ gas is pushed back by the $N_2$ gas flowing along the rotation direction and suction force by the evacuation port 72, and changes the flow direction toward the edge of the turntable 2 and the inner circumferential wall of the chamber body 12. Another part of the $O_3$ gas hits and flows along the top surface of the turntable 2 (and the surface of the wafers W) in the same direction as the rotation direction of the turntable 2 to reach the separation area D located downstream of the rotation direction of the turntable 2 in relation to the group 4 of the oxidizing gas nozzles. However, because the height h and the arc length of the ceiling surface 54 of the convex portion 5 are designed so that the O$_3$ gas is impeded from flowing into the gap under film deposition conditions (gas flow rates, a process pressure, a rotation speed of the turntable 2, and the like) at the time of the film deposition, the O$_3$ gas cannot flow into the gap (see the subsection (b) of FIG. 4). Even when a small fraction of the O$_3$ gas flows into the gap, the fraction of the O$_3$ gas cannot flow farther into the separation area D, because the fraction of the O$_3$ gas can be pushed backward by the N$_2$ gas ejected from the separation gas nozzle 51. Therefore, substantially all the parts of the O$_3$ gas flowing along the top surface of the turntable 2 in the rotation direction flow into the evacuation area 7 and is evacuated by the evacuation port 72, as shown in FIG. 12.

In addition, part of the BTBAS gas ejected from the first main reaction gas nozzle 31, the first center side compensation gas nozzle 32, and the first circumferential side compensation gas nozzle 33 to flow along the top surface of the turntable 2 (and the surface of the wafers W) in a direction opposite to the rotation direction of the turntable 2 is impeded from flowing into the thin space below the convex portion 5, which has a sector-like top view shape, located upstream relative to the rotation direction of the turntable 2 in relation to the first reaction gas supplying nozzle 31. Even if only a fraction of the BTBAS gas flows into the thin space, this BTBAS gas is pushed backward by the N$_2$ gas ejected from the separation gas nozzle 52 in the separation area D. The BTBAS gas pushed backward flows toward the outer circumferential edge of the turntable 2 and the inner circumferential wall of the chamber body 12, along with the N$_2$ gases from the center portion C, and then is evacuated by the evacuation port 71 through the evacuation area 7. As stated above, the separation areas D may prevent the BTBAS gas and the O$_3$ gas from flowing thereinto, or may greatly reduce the amount of the BTBAS gas and the O$_3$ gas flowing thereinto, or may push the BTBAS gas and the O$_3$ gas backward. The BTBAS molecules and the O$_3$ molecules adsorbed on the wafer W are allowed to go through the separation area D, contributing to the film deposition.

While it seems that the BTBAS gas in the first process area P1 (the O$_3$ gas in the second process area P2) may enter the center area C, because the separation gas is ejected from the center area C toward the outer circumference of the turntable 2 as shown in FIG. 12, the BTBAS gas (the O$_3$ gas) is impeded from flowing into the center area C, or even when the BTBAS gas (the O$_3$ gas) enters the center area C, the BTBAS gas (the O$_3$ gas) is pushed backward. Therefore, the BTBAS gas (the O$_3$ gas) is impeded from flowing into the second process area P2 (first process area P1).

Moreover, because the bent portion 56 is formed downward from the outer circumferential portion of the convex portion 5, which provides the narrow space between the bent portion 56 and the outer circumferential surface of the turntable 2, gaseous communication through the space is substantially prevented. Namely, the BTBAS gas in the first process area P1 (the O$_3$ gas in the second process area P2) is prevented from flowing into the second process area P2 (the first process area P1) through the space between the turntable 2 and the inner circumferential wall of the chamber body 12. Therefore, the first process area P1 and the second process area P2 are substantially completely separated by the two separation areas S, and the BTBAS gas and the O$_3$ gas are exclusively evacuated from the evacuation ports 71, 72, respectively. As a result, the BTBAS gas and the O$_3$ gas are not intermixed in a gaseous phase in the vacuum chamber 1. Incidentally, because the heater unit housing space below the turntable 2 is purged with the N$_2$ gas, the BTBAS gas that has flowed into the evacuation area 7 cannot flow into the second process area P2 through the heater unit housing space. After the film deposition is completed, the wafers W are transferred out from the vacuum chamber 1 by the lift pins 16 and the transfer arm 10 in accordance with procedures opposite to the procedures when the wafers W are placed in the corresponding concave portions 24.

An example of process parameters preferable in the film deposition apparatus according to this embodiment is exemplified in the following. A rotational speed of the turntable 2 is 1 through 500 rpm (in the case of the wafer W having a diameter of 300 mm). A pressure in the chamber 1 is about 1067 Pa (about 8 Torr). A wafer temperature is about 350° C. A flow rate of the BTBAS gas from the first main gas nozzle 31 is about 100 sccm; and flow rates of the BTBAS gas from the first center side compensation gas nozzle 32 and first circumferential side compensation gas nozzle 33 are about 50 sccm. A flow rate of O$_3$ gas from the second main gas nozzle 41 is about 10000 sccm; and flow rates of the O$_3$ gas from the second center side compensation gas nozzle 42 and the second circumferential side compensation gas nozzle 43 are about 1000 sccm. A flow rate of the N$_2$ gas from the separation gas nozzles 51, 52 is about 20000 sccm. A flow rate of the N$_2$ gas from the separation gas supplying pipe 61 is about 5000 sccm. The number of rotations of the turntable 2 is 600 rotations, for example, although this number depends on the film thickness required.

According to the above embodiment, because the plural wafers W are arranged in the rotation direction on the turntable 2 and alternately pass through the first process area P1 and the second process area P2, thereby carrying out the ALD, the film is deposited on the wafers W at higher throughput. In addition, because the separation areas D including the corresponding separation gas nozzles 51, 52 and the lower ceiling surface 54 are arranged between the first process area P1 and the second process area P2 along the rotation direction of the turntable 2, and the center area C defined by the rotation center portion of the turntable 2 and the vacuum chamber 1 in order to eject the separation gas toward the circumference of the turntable 2 is provided, the reaction gases (the source gas and the oxidizing gas in this embodiment) are evacuated through the corresponding evacuation areas 7, along with the separation gases from the separation areas D and the center area C, and thus are impeded from being intermixed. Therefore, substantially ideal ALD can be carried out. In addition, a reaction product is not produced, or reduced to a great degree on the turntable 2, thereby reducing a particle problem. Incidentally, only one wafer W may be placed on the turntable 2.

In a film deposition apparatus employing a turntable, it is difficult to maintain a uniform reaction gas concentration along the radius direction of the turntable when only one reaction gas nozzle is used, because the gas flow is likely to be affected by differences in a tangential speed of the turntable and the like. However, according to this embodiment of the present invention, the reaction gas can be supplied from one or both of the first center side compensation gas nozzle 32 and the first circumferential side compensation gas nozzle 33 to an area with a lower reaction gas concentration along the radius direction of the turntable 2. Therefore, the concentration of the reaction gas can be uniform along the radius direction of the turntable 2. In addition, the concentration of the oxidizing gas can be uniform, in the same manner. Accordingly, the film having improved thickness and proper uniformities can be deposited on the wafers W.

A reason why the film becomes thinner in the center side and thicker in the circumferential side of the turntable 2 as shown in the subsection (a) of FIG. 10 may be as follows. In the film deposition apparatus according to this embodiment of the present invention, the $N_2$ gas is supplied from the center area C defined by the center portion of the turntable 2 and the vacuum chamber 1. Therefore, the reaction gas is attenuated by this $N_2$ gas in the center side, and thus the concentration of the reaction gas is reduced in the center side. As a result, the film becomes thinner in the center side and thicker in the circumferential side along the radius direction of the turntable 2.

In addition, a reason why the film becomes thicker in the center side and thinner in the circumferential side of the turntable 2 as shown in the subsection (a) of FIG. 11 may be as follows. When the turntable 2 is rotated, the tangential speed of the turntable 2 becomes higher toward the circumference of the turntable 2, and thus the gas concentrations in the circumferential side of the turntable 2 tend to be lower, even when the source gas is supplied at a constant concentration along a longitudinal direction of the first main gas nozzle 31 and the oxidizing gas is supplied at a constant concentration along a longitudinal direction of the second main gas nozzle 32.

Moreover, the $N_2$ gas flows toward the evacuation ports 71, 72 arranged outside of the turntable 2, which may attenuate the reaction gas and/or the oxidizing gas in the circumferential side of the turntable 2. In this case, the gas concentration becomes lower in the circumferential side of the turntable 2, and thus the film becomes thinner in the circumferential side of the turntable 2.

As stated above, even when the reaction gas and the $O_3$ gas are supplied from the first main gas nozzle 31 and the second main gas nozzle 32, respectively, at constant concentrations, it is difficult to maintain the gas concentrations uniform in the vacuum chamber 1. However, according to the film deposition apparatus of this embodiment, the gas concentrations can be maintained uniform along the radius direction of the turntable 2 by supplying the concentration compensation gases from the first compensation gas nozzles 32, 33 and the second compensation gas nozzle 42, 43.

In addition, even when the target thickness is changed or the process conditions (gas flow rates, a process pressure, a rotation speed of the turntable 2, and the like) are changed, the gas concentration along the radius direction of the turntable 2 can be adjusted by using the first compensation gas nozzles 32, 33 and the second compensation gas nozzle 42, 43. Therefore, the gas concentration along the radius direction of the turntable 2 can be adjusted in a wider range and thus the uniformity across the wafer W can be easily improved, compared to when the first main gas nozzle 31 and the second main gas nozzle 32 are only used.

Figure 13:
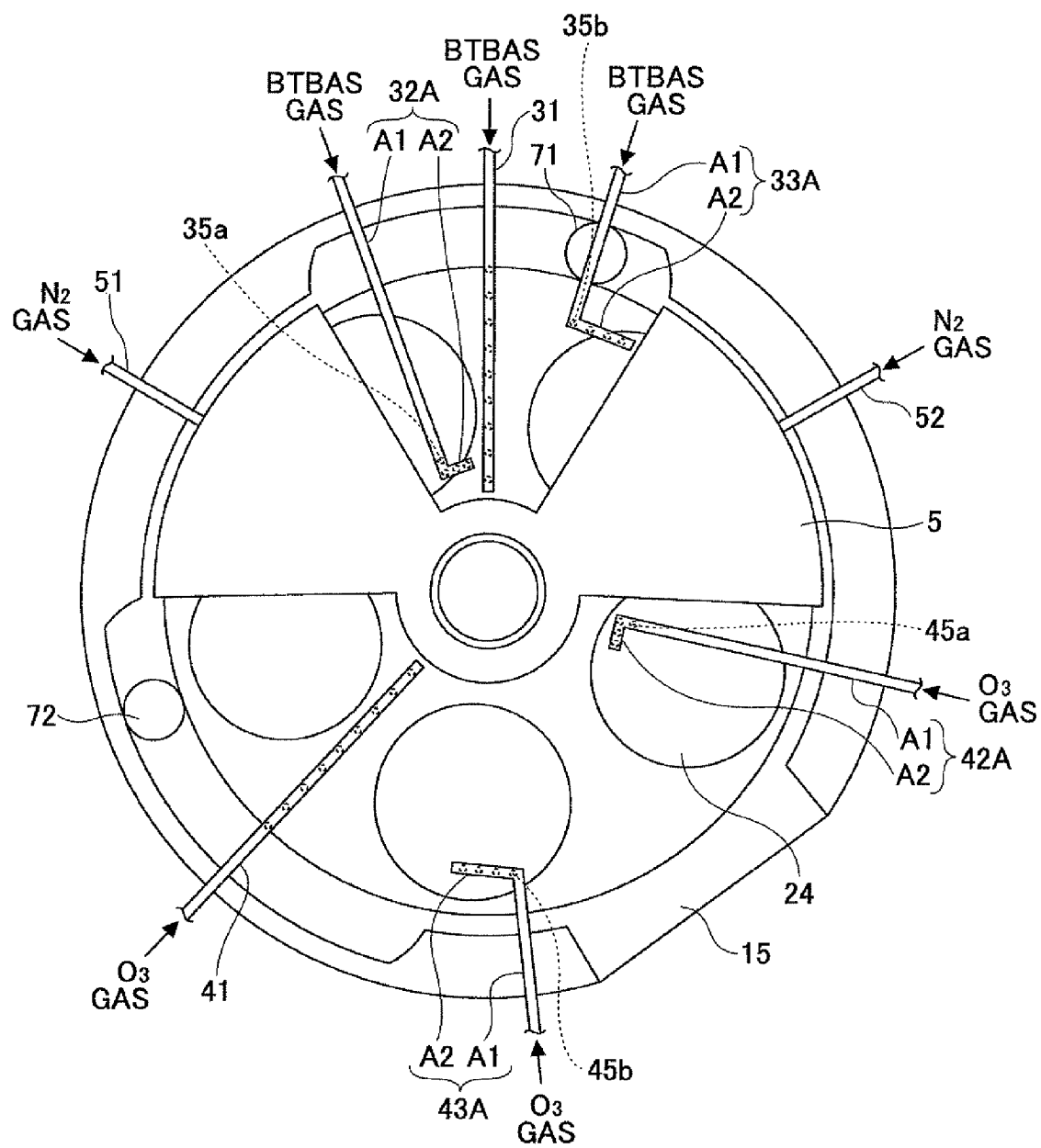
FIG. 13 is a plan view illustrating another example of the compensation gas nozzle.

Moreover, the compensation gas nozzles may be configured to extend along the circumferential direction of the turntable 2, as illustrated in FIG. 13, in other embodiments. In the illustrated example, the first and the second center side compensation gas nozzles 32A, 42A include a first portion A1 that extends along the radius direction from the base end and a second portion A2 that is connected to be in gaseous communication with the first portion A1 and bends along the circumferential direction of the turntable 2 from the first portion A1. Ejection holes 35a, 45a are formed in lower surfaces of, for example, the second portions A2 of the corresponding compensation gas nozzles 32A, 42A. In addition, first and second circumferential side gas nozzles 33A, 43A include a first portion A1 that extends along the radius direction from the base end and a second portion A2 that is connected to be in gaseous communication with the first portion A1 and bends along the circumferential direction of the turntable 2 from the first portion A1. Ejection holes 35b, 45b are formed in lower surfaces of, for example, the second portions A2 of the corresponding compensation gas nozzles 33A, 43A. Use of such compensation gas nozzles 32A, 33A, 42A, 43A provides an advantage in that the wafers W can be exposed to the reaction gases for a longer time, because areas where the ejection holes 35a, 35b, 45a, 45b are formed extend in a direction that the wafer W moves along.

Figure 14:
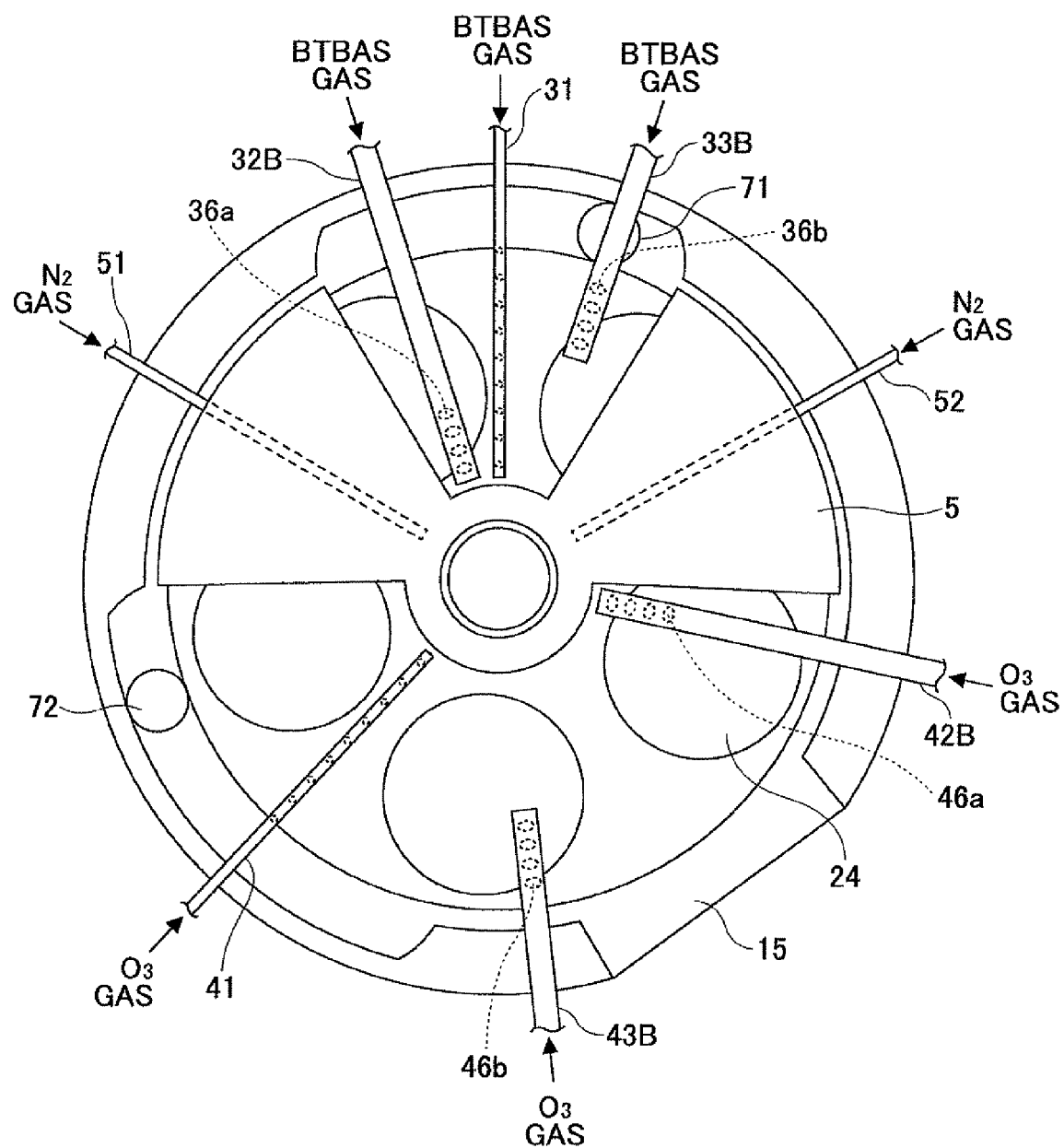
FIG. 14 is a plan view illustrating yet another example of the compensation gas nozzle.

In yet other embodiments, the compensation gas nozzles may be configured as illustrated in FIG. 14. Namely, the compensation gas nozzles 32B, 33B, 42B, 43B are wider than the first and the second main gas nozzles 31, 41 and have corresponding ejection holes 36a, 36b, 46a, 46b having elliptical shapes on their lower surfaces. Such compensation gas nozzles 32B, 33B, 42B, 43B may be configured by pipes having a larger diameter than the diameters of the first and the second main gas nozzles 31, 41. Alternatively, the compensation gas nozzles 32B, 33B, 42B, 43B may be configured by pipes having an elliptical cross-sectional shape. In this case, the major axis of the ellipse extends in parallel with the upper surface of the turntable 2. Because the ejection holes 36a, 36b, 46a, 46b of the corresponding compensation gas nozzles 32B, 33B, 42B, 43B are longer along the circumferential direction of the turntable 2 than the ejection holes 34a, 44a of the corresponding main gas nozzles 31, 41, the gas ejected from the compensation gas nozzles 32B, 33B, 42B, 43B may be in contact with the wafers W for a longer time.

Incidentally, the compensation gas nozzles 42, 43 provided for the second main gas nozzle 41 in the above embodiments are not always necessary. In addition, compensation gas nozzles may be provided for the separation gas nozzles 51, 52 in order to compensate for concentration of the separation gas in the center side and/or the circumferential side along the radius direction of the turntable 2. Moreover, not being limited to the two compensation gas nozzles 32, 33 (42, 43), three or more compensation nozzles may be provided for the first (second) main gas nozzle 31 (41). In addition, the compensation gas nozzles 32, 33, 42, 43 may be arranged at positions different from the illustrated positions in the vacuum chamber 1, as long as the reaction gases for compensation can be supplied to areas with lower gas concentration. Moreover, one compensation gas nozzle may be used in order to supply the reaction gas for compensation to plural areas along the radius direction of the turntable 2. Furthermore, while the ejection holes are formed in a predetermined range in the compensation gas nozzles, the compensation gas nozzle may have the ejection holes entirely along the longitudinal direction of the compensation gas nozzle. In this case, the compensation gas nozzle has larger ejection holes in a predetermined range or ejection holes at smaller intervals in a predetermined range. In such a manner, a larger amount of the reaction gas for compensation can be supplied to areas with the lower concentration of the reaction gas along the radius direction of the turntable 2, thereby compensating for the gas concentration. Moreover, the ejection holes may be formed as slits rather than circular or elliptical holes. Alternatively, the ejection holes may have other shapes in other embodiments.

Figure 15:
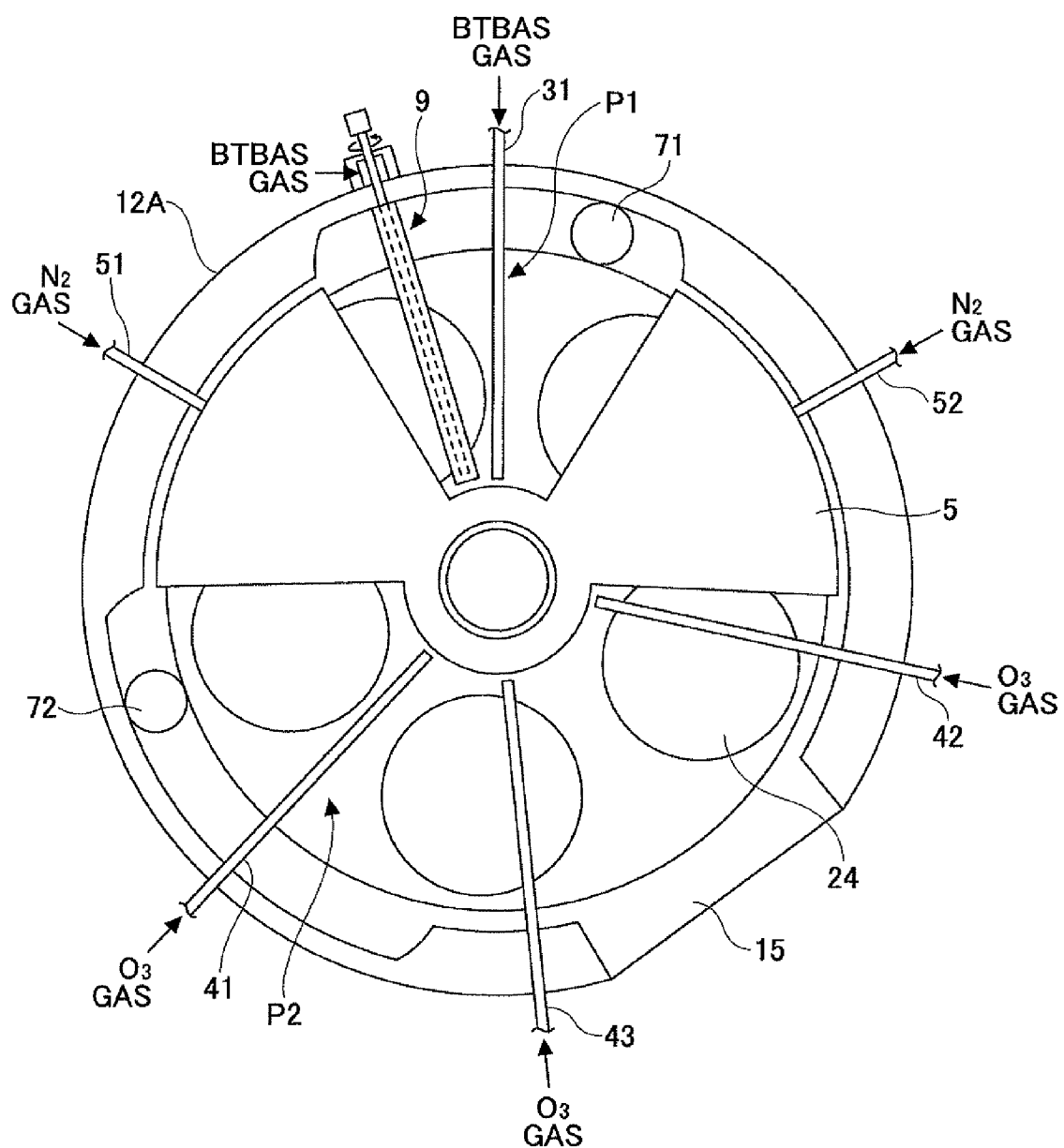
FIG. 15 is a plan view illustrating an ejection position adjusting gas nozzle.

Next, another embodiment of the present invention is explained with reference to FIGS. 15 through 18. In this embodiment, an ejection position adjustment gas nozzle 9 is used. The ejection position adjustment gas nozzle 9 is capable of adjusting an amount of the reaction gas along a longitudinal direction of the ejection position adjustment gas nozzle 9. Referring to FIG. 15, the ejection position adjustment gas nozzle 9 is arranged to extend along the radius direction of the turntable 2 from the circumferential wall 12A of the chamber body 12 to a vicinity of the rotation center of the turntable 2. Specifically, the ejection position adjustment gas nozzle 9 is arranged upstream relative to the first main gas nozzle 31 in relation to the rotation direction of the turntable 2 in the first process area P1 and attached in the circumferential wall 12A of the chamber body 12.

Figure 16:
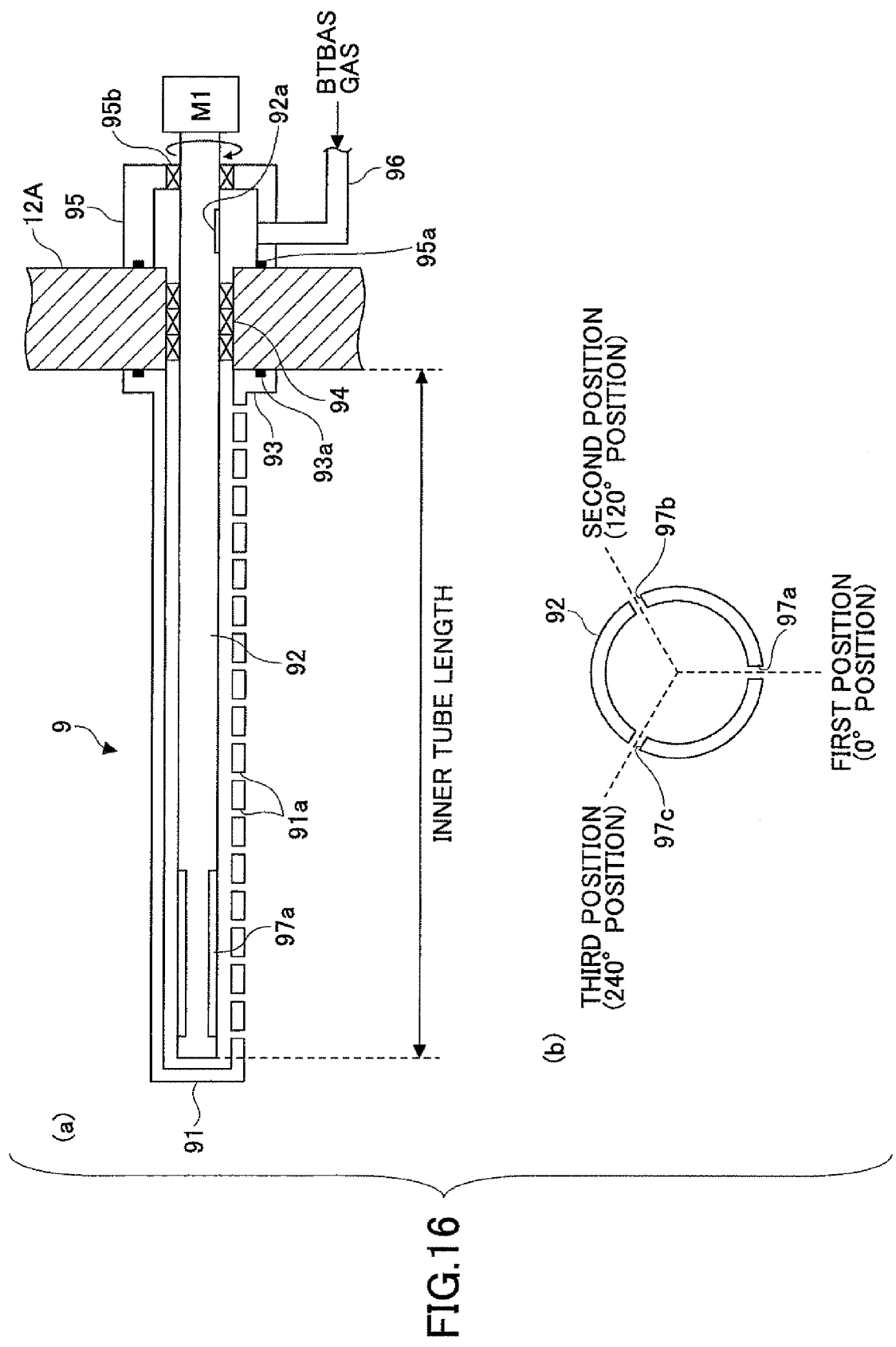
FIG. 16 is a cross-sectional view illustrating the ejection position adjusting gas nozzle.

Referring to FIG. 16, the ejection position adjustment gas nozzle 9 has a double tube structure composed of an outer tube 91 and an inner tube 92 that is provided inside and concentric to the outer tube 91. The inner tube 92 is rotatable around a horizontal center axis. An inner diameter of the outer tube 91 is about 10 mm through about 14 mm, for example, and an outer diameter of the inner tube 92 is about 6 mm through about 8 mm, for example. An annular gap between the outer tube 91 and the inner tube 92 is about 1 mm through 2 mm, for example, and preferably, about 1 mm.

A base end portion of the outer tube 91 is configured as, for example, a flange portion 93 and hermetically attached to the circumferential wall 12A of the chamber body 12 via an O-ring 93a serving as a sealing member. Ejection holes 91a are formed in a lower surface of the outer tube 91 at predetermined intervals along a longitudinal direction of the outer tube 91. In addition, a base end portion of the inner tube 92 goes through the circumferential wall 12A of the chamber body 12, extends out from the vacuum chamber 12, and is connected to a motor M1 as a rotation mechanism that rotates the inner tube 92 around the horizontal center axis. A sealing member such as a magnetic sealing member 94 that also serves as a bearing is provided between the inner tube 92 and the circumferential wall 12A of the chamber body 12. In the illustrated example, a gas supplying chamber 95 is provided on the outer surface of the circumferential wall 12A in order to surround the inner tube 92 extending out from the chamber body 12. The gas supplying chamber 95 is hermetically connected to the outer surface of the circumferential wall 12A via an O-ring 95a as a sealing member. Another sealing member such as a magnetic sealing member 95b that also serves as a bearing is provided between the gas supplying chamber 95 and the inner tube 92, so that the inner tube 92 is rotatable while the inner environment of the vacuum chamber 1 is hermetically maintained.

Figure 17:
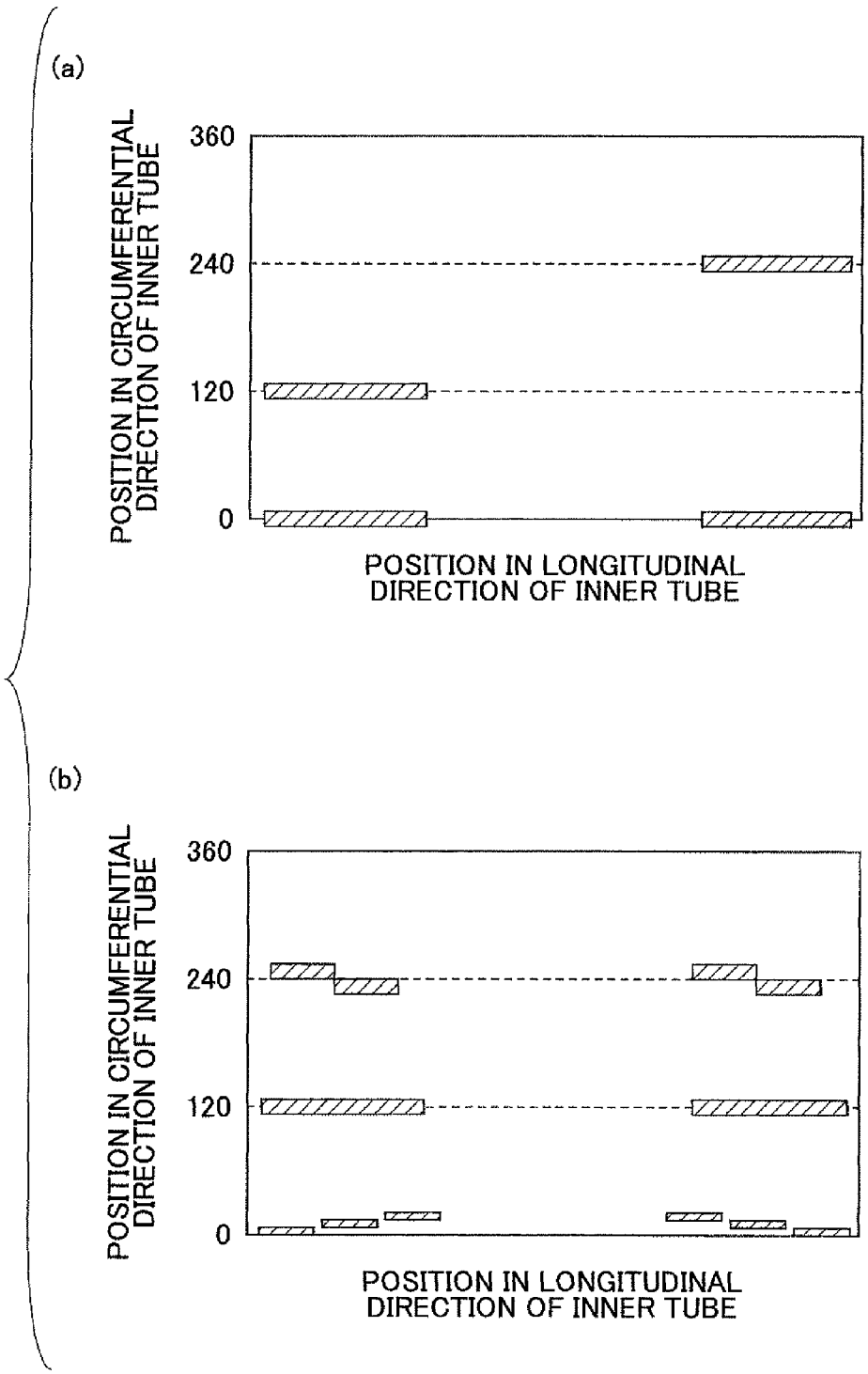
FIG. 17 is an explanatory view illustrating positions of slits formed in an inner tube of the ejection position adjusting gas nozzle.

A source gas supplying conduit 96 is connected to the gas supplying chamber 95, and a gas inlet opening 92a is formed in a portion of the inner tube 92 in the gas supplying chamber 95. With this configuration, the source gas is supplied into the inner tube 92. In addition, plural slits 97 as gas ejection openings are formed in the inner tube 92 and extend along a longitudinal direction of the inner tube 92. The plural slits 97 serve as a conductance adjusting member. As shown in FIGS. 16 and 17, the plural slits 97 are formed in different positions along the longitudinal direction and a circumferential direction of the inner tube 92.

The slits 97 are formed in different patterns in a first position (0° position), a second position (120° position), and a third position (240° position) in the circumferential direction of the inner tube 92, as shown in a subsection (b) of FIG. 16. These patterns are specifically explained with reference to FIG. 17. In a subsection (a) of FIG. 17, the horizontal axis represents the longitudinal direction of the inner tube 92 within the vacuum chamber 1; the vertical axis represents the circumferential direction of the inner tube 92; and hatched areas represent the slits 97. Referring to the subsection (a) of FIG. 17, two slits 97a of the first position are formed in a distal end area and in a base end area, respectively. In addition, a silt 97b of the second position is formed in the distal end area, and a slit 97c of the third position is formed in the base end area.

Incidentally, the distal end area corresponds to the center side of the turntable 2, and the base end area corresponds to the circumferential side of the turntable 2. The gas ejection openings may be provided as plural gas ejection holes formed at predetermined intervals in the distal end area and/or the base end area, rather than the slits 97. Namely, shapes, sizes, and positions of the gas ejection openings may be arbitrarily determined, as long as the ejection position adjustment gas nozzle 9 can supply the reaction gas to an area with a lower gas concentration. The other configurations of the ejection position adjustment gas nozzle 9 may be the same as the compensation gas nozzles explained above.

According to the ejection position adjustment gas nozzle 9, the reaction gas introduced into the inner tube 92 flows out to the gap between the inner tube 92 and the outer tube 91 through the slits 97a through 97c formed in the inner tube 92, and further flows into the vacuum chamber 1 through the ejection holes 91a of the outer tube 91. In this case, gas conductance of an area above the ejection holes 91a of the outer tube 91 is changed depending on positions of the slits 97, and accordingly an amount of the reaction gas to be ejected from the ejection holes 91a may be adjusted. Namely, when the slits 97 of the inner tube 92 are positioned closer to the ejection holes 91a of the outer tube 91, the gap between the inner tube 92 and the outer tube 91 can have greater conductance, and thus a larger amount of the reaction gas can be ejected from the outer tube 91. On the other hand, when the slits 97 of the inner tube 92 are positioned far away from to the ejection holes 91a of the outer tube 91, the gap between the inner tube 92 and the outer tube 91 can have smaller conductance, in part because the gap is as small as about 1 mm, and thus a smaller amount of the reaction gas can be ejected from the outer tube 91. In such a manner, an amount of the reaction gas to be ejected from the ejection position adjustment gas nozzle 9 can be varied along the longitudinal direction of the ejection position adjustment gas nozzle 9. Therefore, the reaction gas for compensation can be supplied to an area with a lower gas concentration along the radius direction of the turntable 2.

Figure 18:
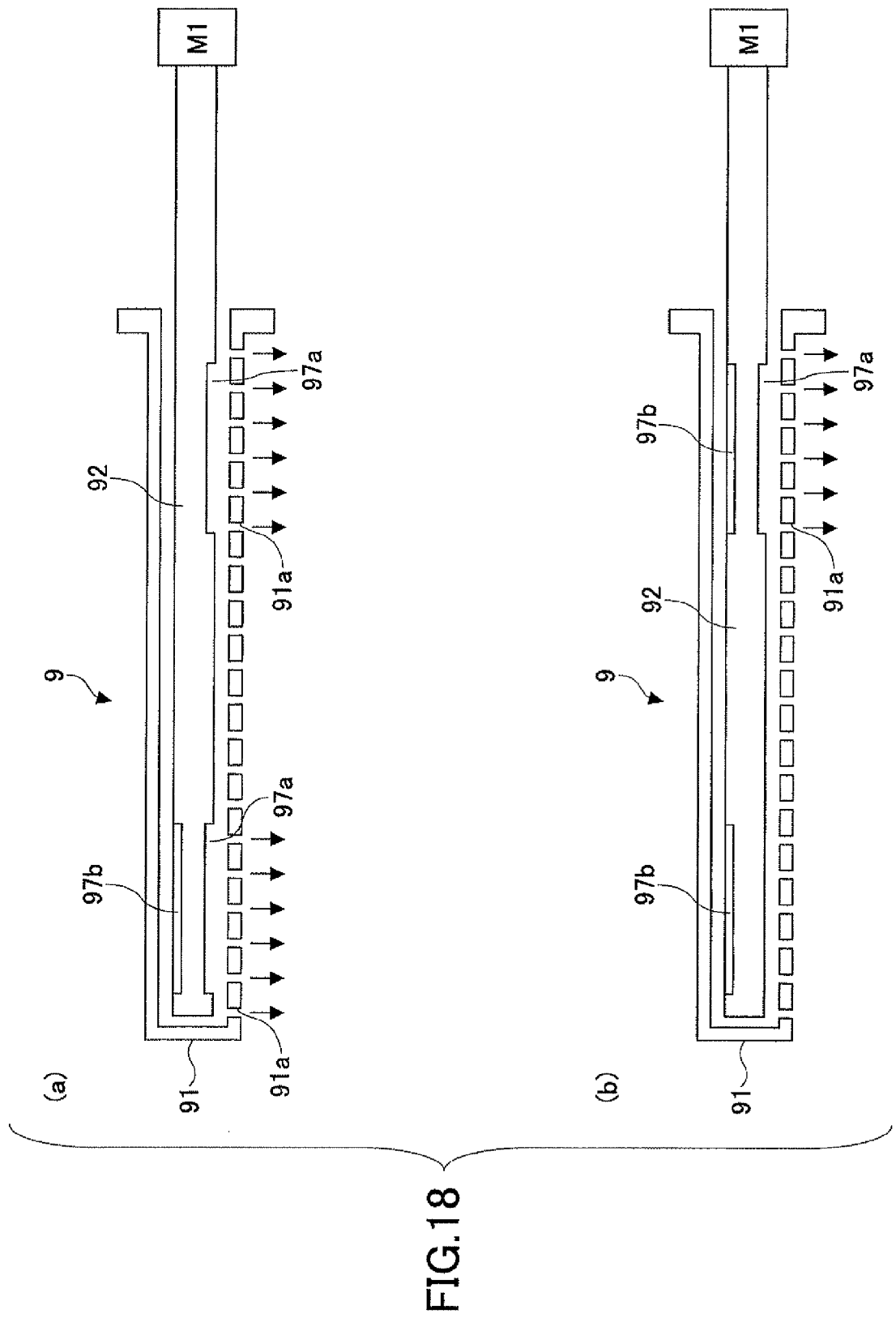
FIG. 18 is an explanatory cross-sectional view for explaining a function of the ejection position adjusting gas nozzle of FIG. 16.

Accordingly, the reaction gas for compensation can be supplied to the area with a lower gas concentration along the radius direction of the turntable 2 by rotating the inner tube 92 so that the slits 97 oppose the ejection holes 91a of the outer tube 91 in positions corresponding to the areas. For example, a subsection (a) of FIG. 18 illustrates a case where the inner tube 92 is rotated so that the slits 97a of the 0° position (first position) oppose the ejection holes 91a. With this, a larger amount of the reaction gas is ejected from the ejection holes 91a above which the slits 97a are positioned. In other words, a larger amount of the reaction gas is supplied from the distal end area and the base area of the ejection position adjustment gas nozzle 9, in the illustrated example. In addition, a subsection (b) of FIG. 18 illustrates a case where the inner tube 92 is rotated so that the slit 97c of the 240° position (third position) opposes the ejection holes 91a. In this case, a larger amount of the reaction gas is supplied from the base end area of the ejection position adjustment gas nozzle 9.

According to this embodiment, the gas concentration distribution of the source gas as the first reaction gas along the radius direction of the turntable 2 can be adjusted by rotating the inner tube 92 of the ejection position adjustment gas nozzle 9, thereby improving the gas concentration uniformity along the radius direction of the turntable 2 and thus the film thickness uniformity. Namely, the inner tube 92 may be rotated so that the slits 97 of the inner tube 92 opposes the ejection holes 91a of the outer tube 91 corresponding to the area to which a larger amount of the reaction gas needs to be supplied. In addition, the slits 97 of the inner tube 92 may be formed in a pattern shown in a subsection (b) of FIG. 17. Moreover, the slits 97 may be formed at only one position along the circumferential direction of the inner tube 92 rather than in the three positions. Furthermore, the ejection position adjustment gas nozzle 9 may be used in the place of the compensation gas nozzles 42, 43 in order to adjust the gas concentration of the oxidizing gas along the radius direction of the turntable 2. In addition, the ejection position adjustment gas nozzle 9 may be used in the place of the separation gas nozzles 51, 52 in order to adjust the gas concentration of the reaction gas along the radius direction of the turntable 2 by using the separation gas.

Next, another example of the ejection position adjustment gas nozzle 9 is explained with reference to FIG. 19. An ejection position adjustment gas nozzle 110 in this example includes a rod member 120 in the place of the inner tube 92. The rod member 120 is accommodated concentrically to and within an outer tube 111, and rotatable around a horizontal center axis of the rod member 120. The rod member 120 includes projection portions 121 as a conductance adjusting member in a circumferential outer surface of the rod member 120. An inner diameter of the outer tube 111 is about 10 mm through about 140 mm, for example, and a gap between the projection portions 121 of the rod member 120 and the inner surface of the outer tube 111 is about 1 mm through about 2 mm, preferably about 1 mm.

A base end portion of the outer tube 111 is configured as a flange portion 112, for example, and attached to the circumferential wall 12A of the chamber body 12 via an O-ring 113 as a sealing member. Ejection holes 114 are arranged at predetermined intervals entirely along a longitudinal direction of the outer tube 111 in a lower surface of the outer tube 111. A reaction gas supplying conduit 115 formed to go through the circumferential wall 12A of the chamber body 12 is connected to a base end portion of the outer tube 111.

A base end portion of the rod member 120 goes through the circumferential wall 12A of the chamber body 12 and is connected to a motor M2 that rotates the rod member 120 around the horizontal center axis of the rod member 120. A reference symbol 116 represents a sealing member that also serves as a bearing, such as a magnetic sealing member. The projection portions 121 for adjusting conductance are formed to occupy a part of the rod member 120 in the circumferential and the longitudinal directions of the rod member 120, so that the projection portions 121 can cover the ejection holes 114 when the projection portions 121 are positioned to oppose the ejection holes 114, as shown in FIG. 19.

In the ejection position adjustment gas nozzle 110, the source gas introduced into the gap between the outer tube 111 and the rod member 120 flows out from the ejection holes 114 of the outer tube 111 into the vacuum chamber 1. In this case, gas conductance of an area above the ejection holes 114 of the outer tube 111 is changed depending on positions of the projection portions 121, and accordingly an amount of the reaction gas to be ejected from the ejection holes 114 may be adjusted. In such a manner, an amount of the reaction gas can be adjusted along the longitudinal direction of the ejection position adjustment gas nozzle 110, thereby supplying the reaction gas for compensation to an area with a lower gas concentration along the radius direction of the turntable 2.

Figure 19:
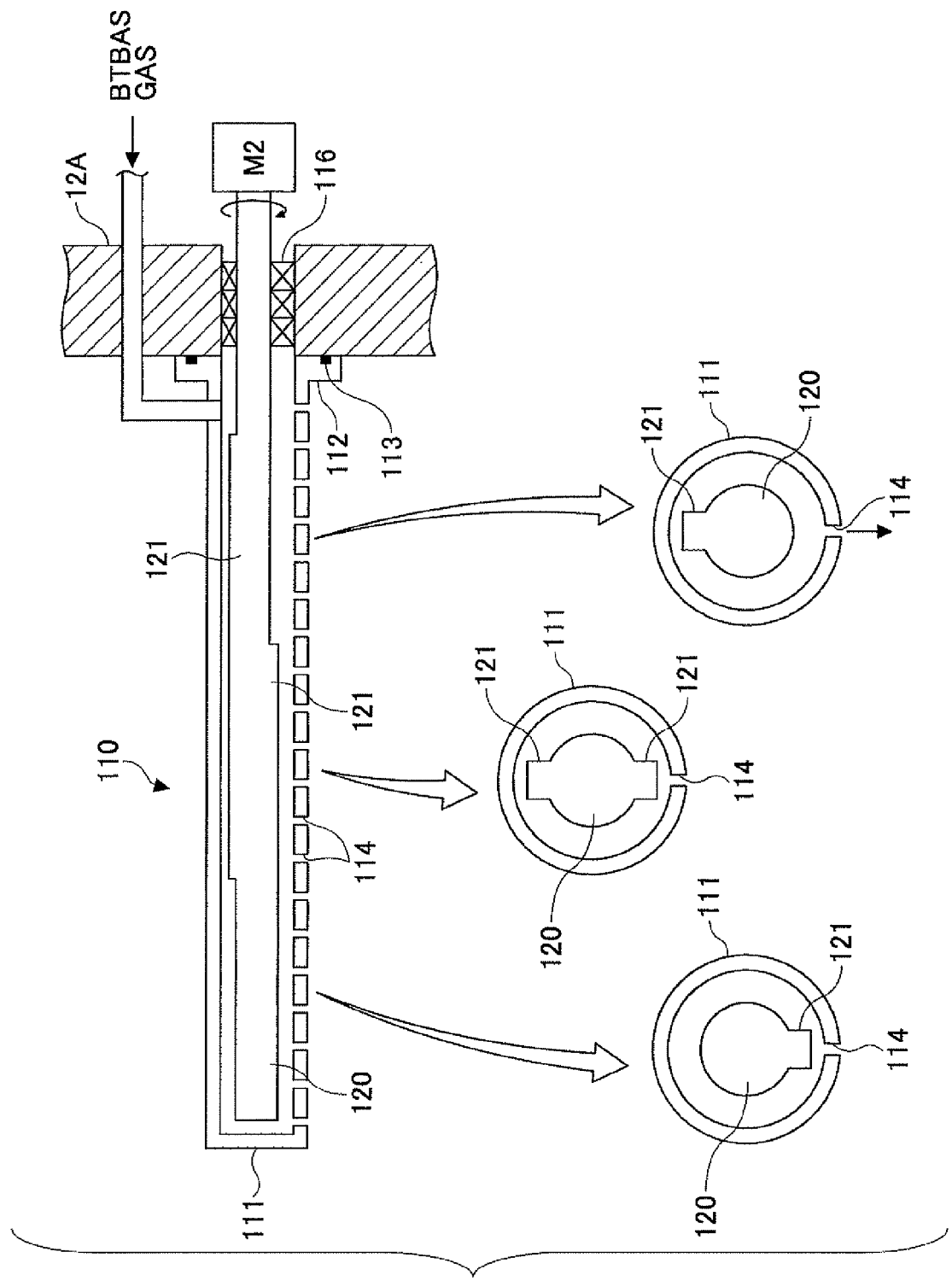
FIG. 19 is a cross-sectional view illustrating another example of the ejection position adjusting gas nozzle.
Figure 20:
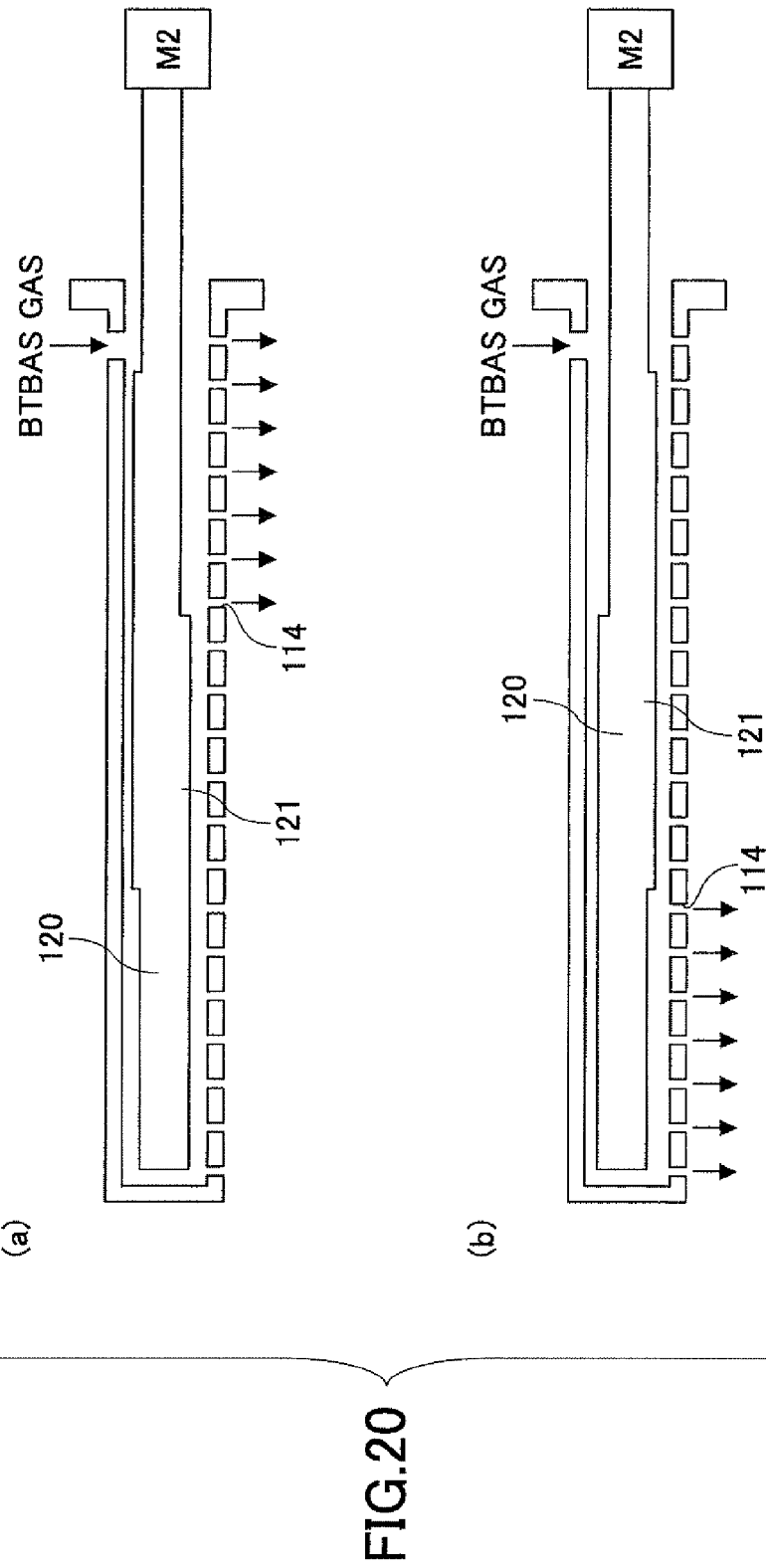
FIG. 20 is an explanatory cross-sectional view for explaining a function of the ejection position adjusting gas nozzle of FIG. 19.

For example, as shown in FIGS. 19 and 20, the gas conductance of an area where the projection portion 121 opposes the ejection holes 114 of the outer tube 111 is smaller, in part because the gap between the rod member 120 and the outer tube 111 is about 1 mm, and thus an amount of the reaction gas ejected from the ejection holes 114 is greatly reduced, or the reaction gas is rarely ejected from the ejection holes 114. On the other hand, because the gas conductance is greater in an area where the projection portion 121 does not oppose the ejection holes 114 of the outer tube 111, a larger amount of the reaction gas can be ejected from the ejection holes 114. Therefore, once the rod member 120 is rotated so that the projection portion 121 does not oppose the ejection holes 114 corresponding to an area with a lower gas concentration, a larger amount of the reaction gas for compensation is supplied to the area, thereby compensating for the gas concentration in the area.

Incidentally, while the ejection position adjustment gas nozzle 110 is rotated by using the motor M2 in order to adjust an amount of the reaction gas to be supplied to an area with a lower gas concentration, the ejection position adjustment gas nozzle 110 may be moved along the longitudinal direction of the ejection position adjustment gas nozzle 110. To this end, a driving mechanism 122 is connected to the rod member 111 outside the circumferential wall 12A of the chamber body 12. The driving mechanism 122 horizontally moves the ejection position adjustment gas nozzle 110 in relation to the outer tube 111 so that the projection portions 121 move closer to or away from the ejection holes 114. With this, when the rod member 111 is moved so that the projection portion 121 is positioned closer to the ejection holes 114 in middle and distal end portions of the outer tube 111 as shown in a subsection (a) of FIG. 21, only a small amount of or substantially none of the reaction gas is ejected from the ejection holes 114 in the middle and distal end portions of the outer tube 111. On the other hand, because the projection portion 121 is positioned away from the ejection holes 114 in a base end portion of the outer tube 111, a larger amount of the reaction gas is ejected from the ejection holes 114 in the base end portion of the outer tube 111. When the rod member 111 is moved so that the projection portion 121 is positioned closer to the ejection holes 114 in the middle and base end portions of the outer tube 111 as shown in a subsection (b) of FIG. 21, a larger amount of the reaction gas is ejected from the ejection holes 114 in the distal end portion of the outer tube 111 because the projection portion 121 is positioned away from the ejection holes 114 in the distal end portion. In such a manner, an amount of the reaction gas for compensation can be adjusted along the longitudinal direction of the ejection position adjustment gas nozzle 110. Incidentally, the outer tube 111 may be moved in relation to the rod member 120.

Figure 22:
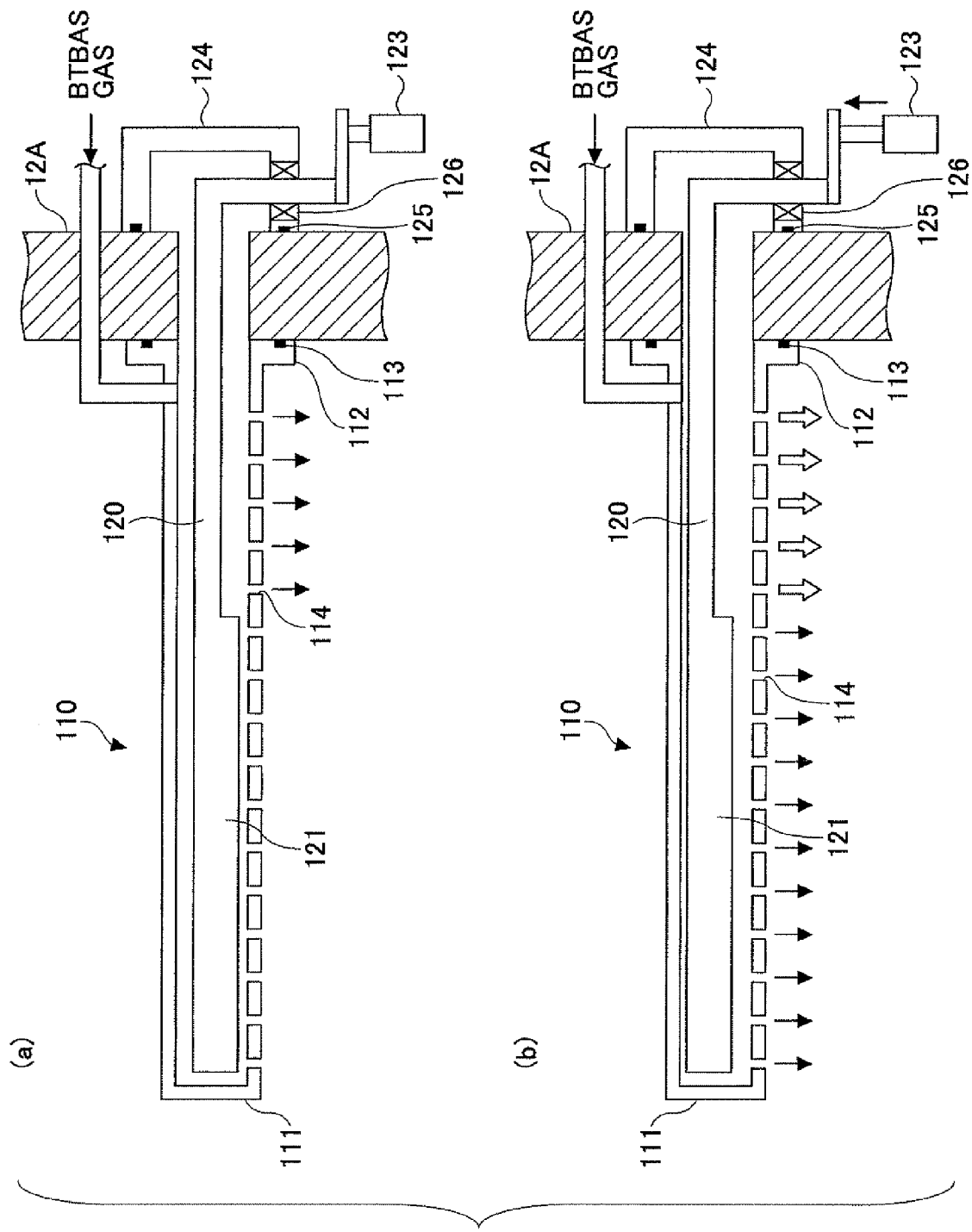
FIG. 22 is a cross-sectional view illustrating yet another example of the ejection position adjusting gas nozzle.

Moreover, the ejection position adjustment gas nozzle 110 may be modified in such a manner that the projection portion 121 can be positioned closer to or away from the ejection holes 114 of the outer tube 111 by vertically moving the rod member 120 in relation to the outer tube 111. To this end, an elevation mechanism 123 that vertically moves the rod member 120 in relation to the outer tube 111 may be used, as shown in FIG. 22. Referring to FIG. 22, a chamber 124 is provided on the outer surface of the circumferential wall 12A of the chamber body 12 in order to surround the rod member 120 outside of the circumferential wall 12A. A reference symbol 125 represents an O-ring as a sealing member, and a reference symbol 126 represents a magnetic sealing member that serves as a sealing member and a bearing. As shown in a subsection (a) of FIG. 22, when the rod member 120 is moved closer to a lower inner surface of the outer tube 111 by the elevation mechanism 123, only a smaller amount of or substantially none of the reaction gas is ejected from the ejection holes 114 in the middle and distal end portions of the outer tube 111 where the projection portion 121 is positioned closer to the ejection holes 114 of the outer tube 111. On the other hand, when the rod member 120 is moved away from the lower inner surface of the outer tube 111 by the elevation mechanism 123, as shown in a subsection (b) of FIG. 22, a medium amount of the reaction gas is ejected from the ejection holes 114 in the middle and distal end portions of the outer tube 111 and a larger amount of the reaction gas is ejected from the ejection holes 114 in the base end portion of the outer tube 111, depending on a distance between the projection portion 121 and the ejection holes 114 of the outer tube 111 (or gas conductance). In such a manner, an amount of the reaction gas for compensation ejected from the ejection holes 114 can be adjusted along the longitudinal direction of the ejection position adjustment gas nozzle 110. Incidentally, the outer tube 111 may be vertically moved rather than the rod member 120.

Figure 21:
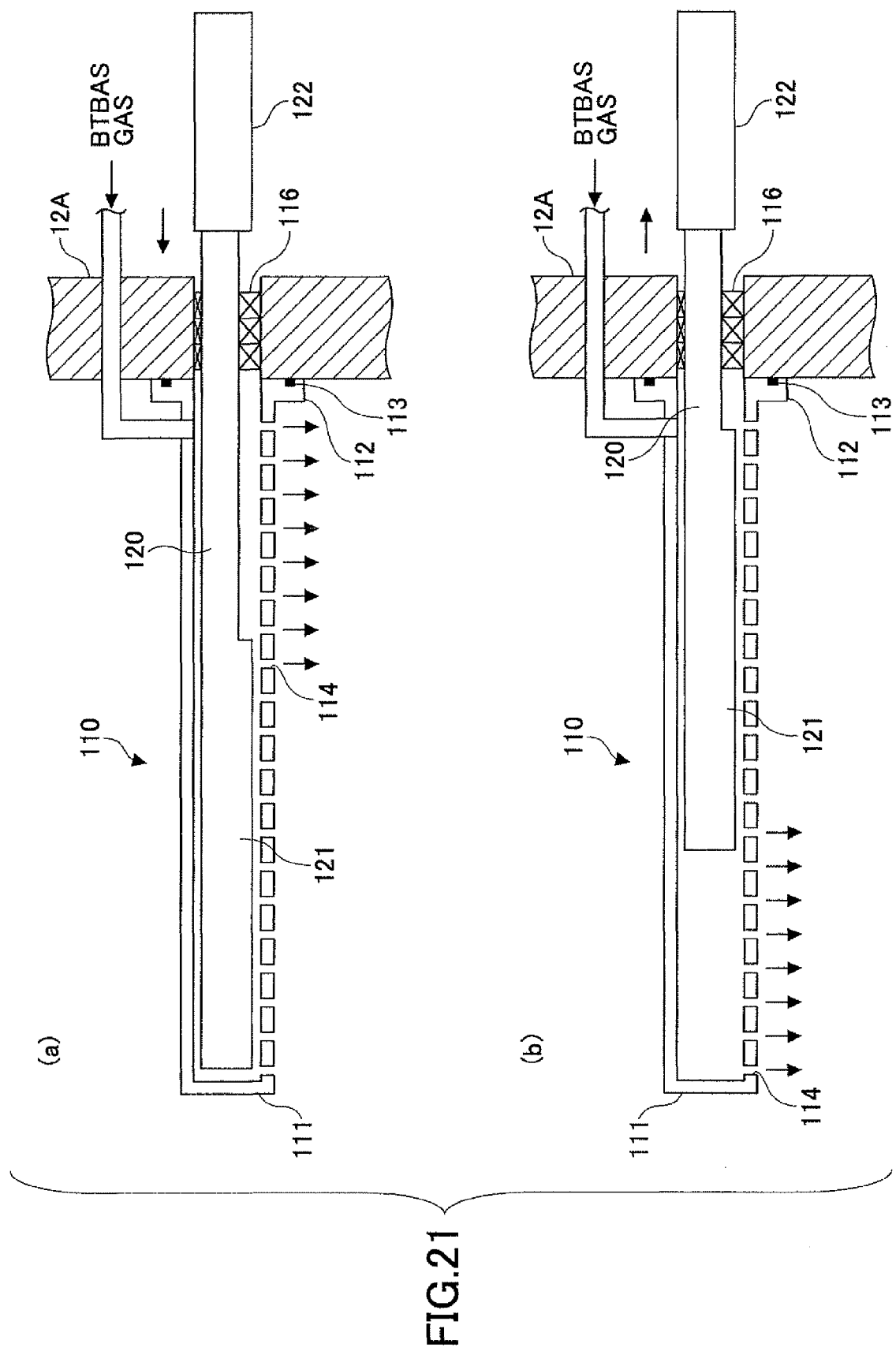
FIG. 21 is a cross-sectional view illustrating another example of the ejection position adjusting gas nozzle.

The ejection position adjustment gas nozzle 110 shown in FIGS. 21, 22 may be used in the place of the compensation gas nozzles 42, 43 in order to adjust the gas concentration of the oxidizing gas along the radius direction of the turntable 2. In addition, the ejection position adjustment gas nozzle 110 may be used in the place of the separation gas nozzles 51, 52 in order to adjust the gas concentration of the reaction gas along the radius direction of the turntable 2 by using the separation gas. Moreover, two or more ejection position adjustment gas nozzles 9, 110 may be used, rather than only one ejection position adjustment gas nozzle 9, 110. Furthermore, the ejection position adjustment gas nozzle(s) 9, 110 may be arranged at positions different from the illustrated positions in the vacuum chamber 1, as long as the reaction gases for compensation can be supplied to areas with lower gas concentration. In addition, the ejection holes 114 of the outer tube 111 may be circular openings or slits, or the shapes and/or sizes may be arbitrarily determined.

Figure 23:
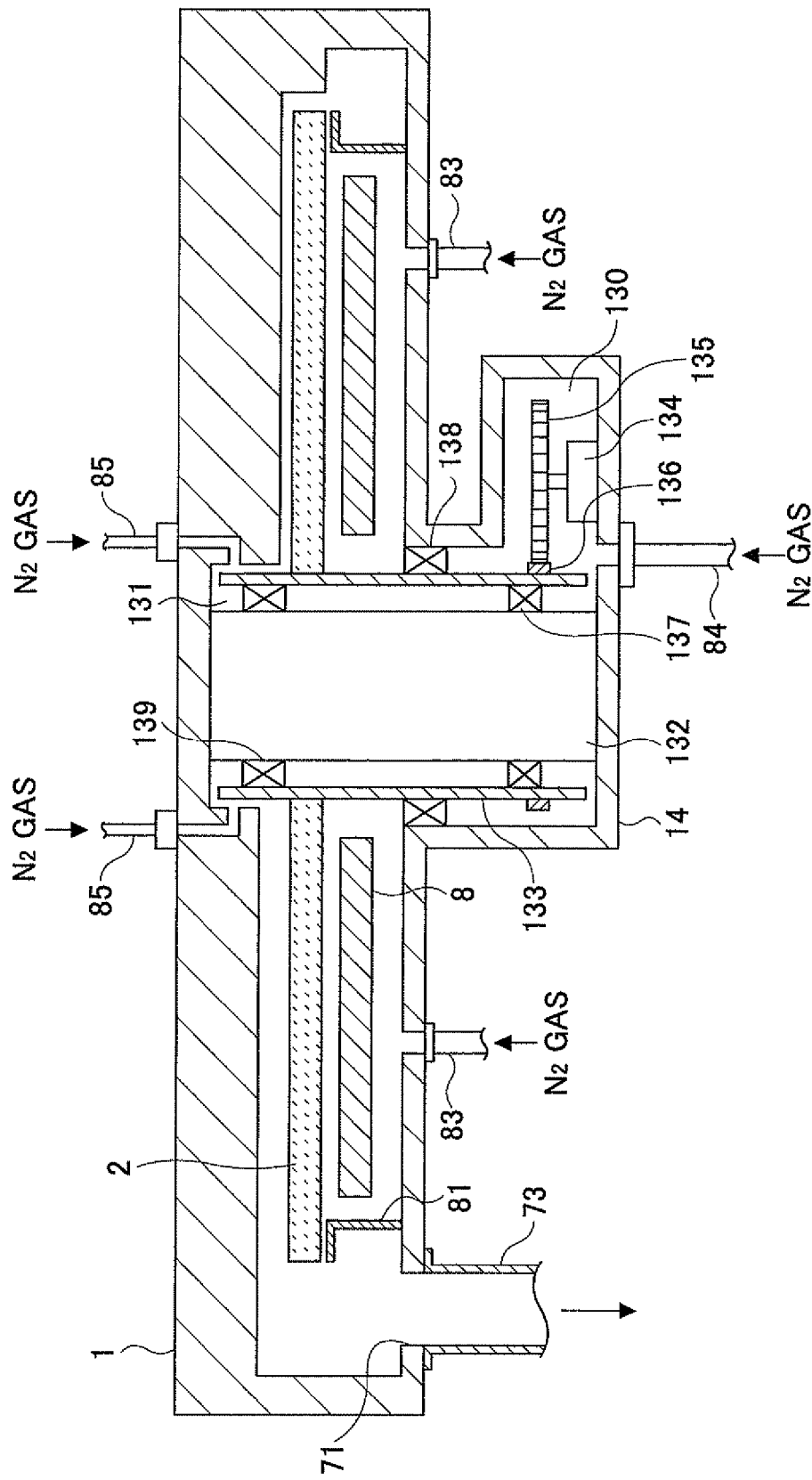
FIG. 23 is a cross-sectional view illustrating a film deposition apparatus according to another embodiment of the present invention.

In the above embodiments, the rotational shaft 22 for rotating the turntable 2 is located in the center portion of the chamber 1 and the separation gas is supplied to the space 62 between the core portion 21 and the ceiling plate 11 in order to impede the reaction gases from being mixed through the center portion. However, the vacuum chamber 1 may be configured as shown in FIG. 23 in other embodiments. Referring to FIG. 23, the bottom portion 14 of the chamber body 12 has a center opening to which a housing space 130 is hermetically attached. Additionally, the ceiling plate 11 has a center concave portion 131. A pillar 132 is placed on the bottom surface of the housing space 130, and a top end portion of the pillar 132 reaches a bottom surface of the center concave portion 131. The pillar 132 can prevent the BTBAS gas ejected from the first main gas nozzle 31 and the O₃ gas ejected from the second main gas nozzle 41 from being intermixed through the center portion of the vacuum chamber 1.

In addition, a rotation sleeve 133 is provided so that the rotation sleeve 133 coaxially surrounds the pillar 132. A ring-shaped turntable 2 is attached at the inner circumference to the outer surface of the rotation sleeve 133. A motor 143 with a driving gear 135 is placed in the housing space 130, and the rotation sleeve 133 can be rotated by the motor 143 via the driving gear 135 and a gear 136 that is provided on the outer circumferential surface of the rotation sleeve 133 and engaged with the driving gear 135. Reference symbols 137, 138, and 139 are bearings. A purge gas supplying pipe 84 is provided in order to supply a purge gas to the housing space 130, and separation gas supplying pipes 85 are connected to an upper center portion of the vacuum chamber 1 in order to supply a separation gas to a space defined by an inner circumferential surface of the center concave portion 131 and an upper portion of the rotation sleeve 133. While two separation gas supplying pipes 85 are illustrated in FIG. 23, three or more separation gas supplying pipes 85 may be provided in order to impede the BTBAS gas and the O₃ gas from being intermixed through a vicinity of the rotation sleeve 133.

In the embodiment illustrated in FIG. 23, a space between the side wall of the concave portion 131 and the upper end portion of the rotation sleeve 133 corresponds to the ejection hole for ejecting the separation gas. In addition, the center area is configured with the ejection hole, the rotation sleeve 133, and the pillar 132.

Figure 24:
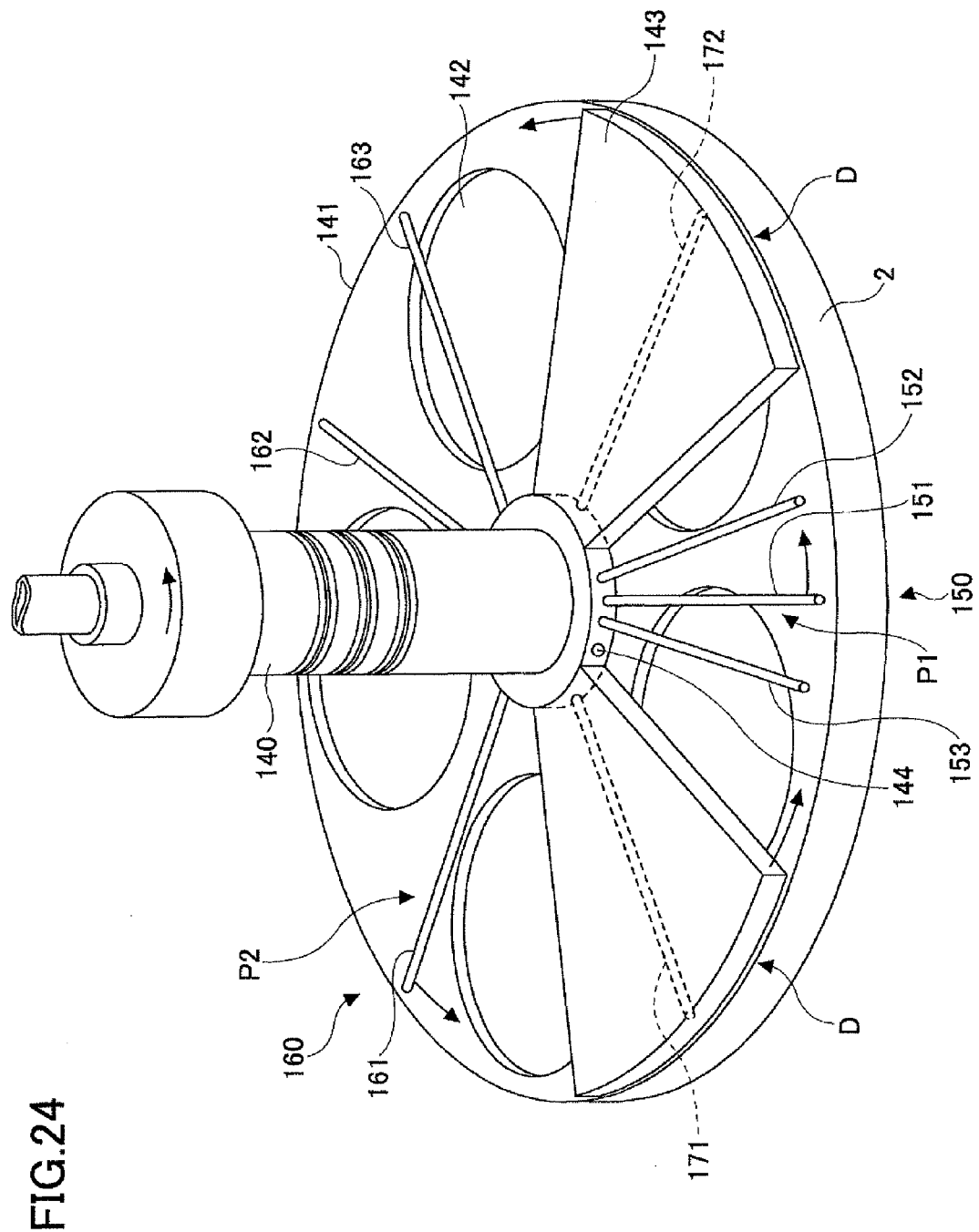
FIG. 24 is a cross-sectional view illustrating a film deposition apparatus according to yet another embodiment of the present invention.

While the turntable 2 is rotated around a vertical axis in the above embodiments, the group 3 of the source gas nozzles, the group 4 of the oxidizing gas nozzles, and the separation gas nozzles 51, 52 (FIG. 2) may be rotated in relation to the turntable 2 as shown in FIG. 24. A film deposition apparatus according to this example is provided with a rotation cylinder 140 that rotates around the vertical axis in the vacuum chamber, and a susceptor 141. The susceptor 141 is different from the turntable 2 in the above embodiments (examples) in that the susceptor 141 is not rotated during the film deposition, but the same as the turntable 2 in the above embodiments (examples) in terms of their configurations. For example, the susceptor 141 includes plural concave portions 142 as substrate receiving portions in an upper surface of the susceptor 141 along the circumferential direction of the susceptor 141.

A group 150 of source gas nozzles (a first main gas nozzle 151, a first center side compensation gas nozzle 152, and a first circumferential side compensation gas nozzle 153), a group 160 of oxidizing gas nozzles (a second main gas nozzle 161, a second center side compensation gas nozzle 162, and a second circumferential side compensation gas nozzle 163), and separation gas nozzles 171, 172 are connected to the rotation cylinder 140 in order to extend along a radius direction of the susceptor 141 and are in gaseous communication with corresponding gas supplying lines inside the rotation cylinder 140. With such configurations, the source gas is supplied toward the susceptor 141 from the group 150 of the source gas nozzles; the oxidizing gas is supplied toward the susceptor 141 from the group 160 of the oxidizing gas nozzles; and the separation gas is supplied toward the susceptor 141 from the separation gas nozzles 171, 172. In addition, convex portions 143 for creating the separation areas D are connected to the rotation cylinder 140, so that the convex portions 143 can be rotated when the rotation cylinder 140 is rotated. Moreover, an evacuation port 144 is provided at a bottom portion of the rotation cylinder 140, and the vacuum chamber 1 (FIG. 1) is evacuated through the evacuation port 144.

In the configuration where the group 150 of the source gas nozzles, the group 160 of the oxidizing gas nozzles, the separation gas nozzles 171, 172, and the convex portions 143 are rotated in relation to the susceptor 141, a gas concentration tends to be varied along a radius direction of the susceptor 141, partly because of different tangential speeds of the susceptor 141 along the radius direction. The compensation gas nozzles 152, 153, 162, 163 for compensating for the nonuniform gas concentration are beneficial because the reaction gases for compensation can be supplied to an area with a lower gas concentration along the radius direction of the susceptor 141.

Although the two kinds of reaction gases are used in the film deposition apparatus according to the above embodiments and the film deposition method using the film deposition apparatus, three or more kinds of reaction gases may be used in other film deposition apparatuses according to other embodiments of the present invention. In this case, a first main gas nozzle, a separation gas nozzle, a second main gas nozzle, a separation gas nozzle, and a third main gas nozzle may be located in this order at predetermined angular intervals, each nozzle extending along the radial direction of the turntable 2 (or susceptor 141). In this case, at least one compensation gas nozzle (or ejection position adjustment gas nozzle) may be provided adjacent to one of the first main gas nozzle, the second main gas nozzle, and the third main gas nozzle in order to supply the corresponding reaction gases to an area with a lower gas concentration, thereby compensating for the gas concentration along the radius direction of the turntable (or susceptor 141).

The reaction gases that may be used in the film deposition apparatus according to embodiments of the present invention are dichlorosilane (DCS), hexachlorodisilane (HCD), Trimethyl Aluminum (TMA), tris(dimethyl amino) silane (3DMAS), tetrakis-ethyl-methyl-amino-zirconium (TEMAZr), tetrakis-ethyl-methyl-amino-hafnium (TEMHf), bis(tetra methyl heptandionate) strontium $(Sr(THD)_2)$, (methyl-pentadionate) (bis-tetra-methyl-heptandionate) titanium (Ti(MPD)(THD)), monoamino-silane, or the like.

Figure 25:
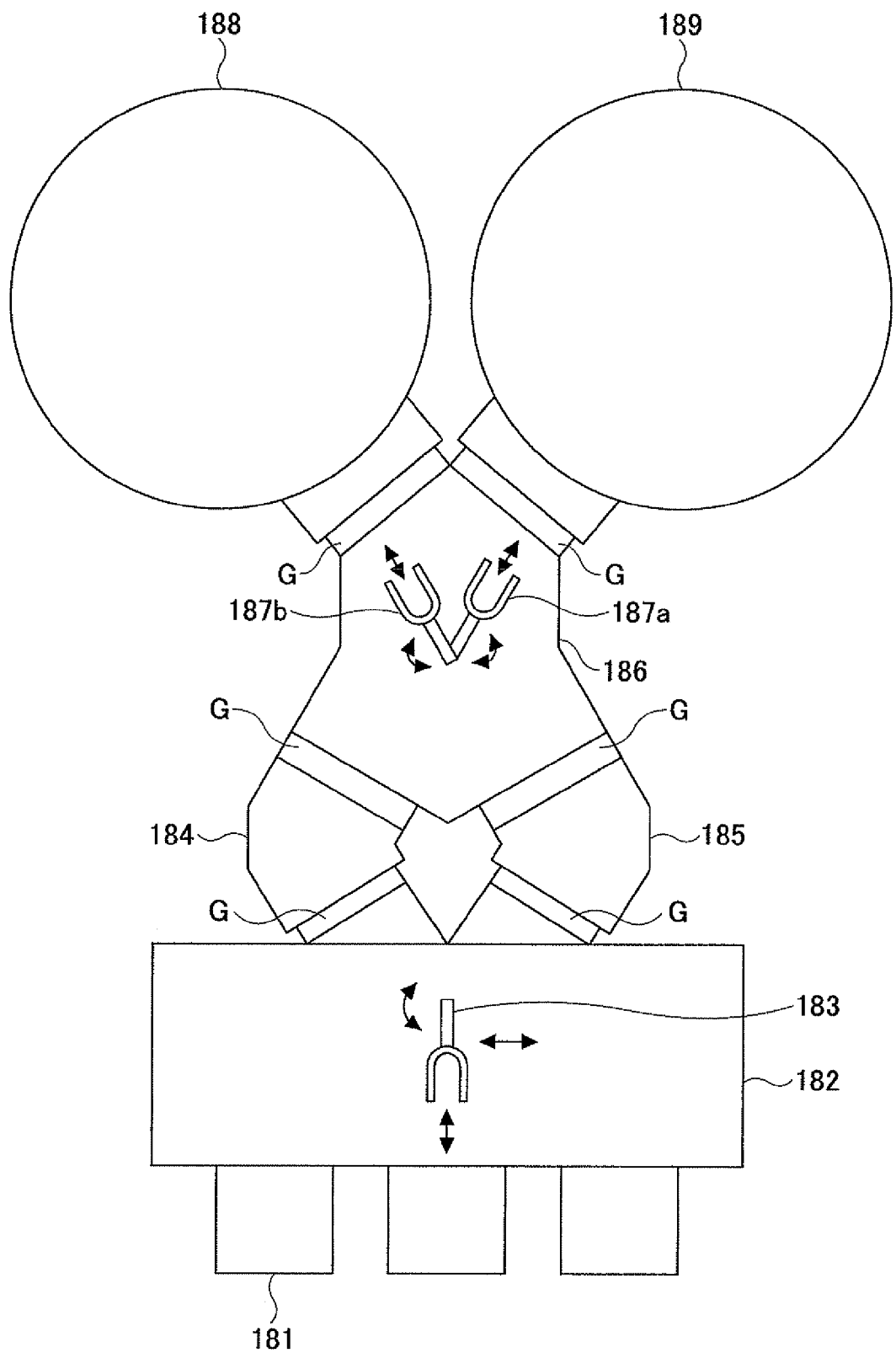
FIG. 25 is a plan view illustrating an example of a substrate process system employing a film deposition apparatus according to an embodiment of the present invention.

The film deposition apparatus according to embodiments of the present invention may be integrated into a substrate process apparatus, an example of which is schematically illustrated in FIG. 25. In this drawing, a reference symbol 181 represents an encapsulated type wafer carrier called a Front Opening Unified Pod (FOUP); a reference symbol 182 represents an atmospheric transfer chamber in which a transfer arm 183 is provided; reference symbols 184, 185 represent load lock chambers (preparation chambers) whose atmosphere is changeable between vacuum and atmospheric pressure; a reference symbol 186 is a vacuum transfer chamber in which two transfer arms 187a, 187b are provided; and reference symbols 188, 189 represent film deposition apparatuses according to embodiments of the present invention. The wafer carrier 181 is transferred onto a transfer in/out port including a carrier stage (not shown), and connected to the atmospheric transfer chamber 182. After a lid of the wafer carrier 181 is removed by an opening/closing mechanism (not shown), a wafer is taken out from the wafer carrier 181 by the transfer arm 183. Next, the wafer is transferred to the load lock chamber 184 (185). After the load lock chamber 184 (185) is evacuated to vacuum, the wafer in the load lock chamber 184 (185) is transferred further to one of the film deposition apparatuses 188, 189 through the vacuum transfer chamber 186 by the transfer arm 187a (187b). In the film deposition apparatus 188 (189), a film is deposited on the wafer in such a manner as described above. Because the substrate process apparatus has two film deposition apparatuses 188, 189 that can house five wafers at a time, the ALD (or MLD) mode deposition can be performed at high throughput.

In the above embodiments of the present invention, the compensation gas nozzle for compensating for the gas concentration along the radius direction of the turntable 2 may be provided for at least one of the main gas nozzles. In this case, both the compensation gas nozzle shown in FIG. 2 and the ejection position adjustment gas nozzle 9 (110) may be used in order to compensate for the gas concentration of the gas supplied from the one of the main gas nozzles. In addition, as long as the main gas nozzle can supply the corresponding reaction gases from the ejection holes along the radius direction of the turntable 2 (susceptor 141) and the compensation gas nozzles can supply the corresponding reaction gases to areas with lower gas concentrations, shapes and sizes of the main gas nozzles and the compensation gas nozzles may be arbitrarily determined, not being limited to a shape of nozzle. The gas ejection openings of the main gas nozzles and the compensation gas nozzles may be circular or elliptical holes, or slits.

The present invention has been explained with reference to several embodiments, the present invention is not limited to the foregoing embodiments, but various alterations and modifications may be applied without departing from the scope of the invention set forth in accompanying claims.

What is claimed is:

1. A film deposition apparatus for depositing a film on a substrate by supplying a reaction gas to an upper surface of the substrate in a vacuum chamber, the film deposition apparatus comprising:
    a susceptor provided in the vacuum chamber, wherein substrate receiving areas are formed along a circle whose center lies in a center portion of the susceptor;
    a main gas supplying portion provided opposing the susceptor in order to supply the reaction gas to the substrate receiving areas of the susceptor;
    a compensation gas supplying portion configured to supply the reaction gas to an upper surface of the susceptor in order to compensate for concentration of the reaction gas supplied from the main gas supplying portion along a radius direction of the susceptor; and
    a rotation mechanism configured to rotate the susceptor relative to the main gas supplying portion and the compensation gas supplying portion around the center portion of the susceptor,
    wherein the compensation gas supplying portion includes at least first and second compensation gas nozzles arranged to sandwich the main gas supplying portion, each of the first and second compensation gas nozzles extending from one of a circumferential portion and the center portion of the susceptor towards the other one of the circumferential portion and the center portion,
    wherein gas ejection openings are formed in the each of the first and second compensation gas nozzles along a longitudinal direction of the each of the first and second compensation gas nozzles,
    wherein a location of an area where the gas ejection openings are formed in one of the first and second compensation gas nozzles in the radius direction of the susceptor is different from that of the other of the first and second compensation gas nozzles,
    wherein the film is formed by supplying the reaction gas only from the main gas supplying portion, and a thickness distribution of the film is measured, thereby obtaining a gas concentration distribution of the reaction gas in a radius direction of the substrate, and
    wherein an amount of the reaction gas supplied from each of the first and second compensation gas nozzles is determined based on the gas concentration distribution of the reaction gas,
    wherein each of the at least first and second compensation gas nozzles includes:
        an outer tube in which the gas ejection openings are formed along a direction from one of the circumferential portion and the center portion of the susceptor towards the other one of the circumferential portion and the center portion;
        an inner member provided concentrically within the outer tube with a gap between the inner member and the outer tube, wherein the inner member is configured as one of a tube member and a rod member, and
        a conductance adjusting member provided in at least a part of the inner member along a longitudinal direction of the inner member in order to adjust gas conductance of a space in the gap above the gas ejection openings of the outer tube;

wherein the film deposition apparatus further comprises a motor configured to rotate the inner member relative to the outer tube, and the inner member has an end portion that sticks out from the vacuum chamber and is connected to the motor so as to rotate the inner member having the conductance adjusting member along a horizontal axis of the inner member, thereby moving the conductance adjusting member between a first position closer to the gas ejection openings of the outer tube and a second position away from the gas ejection openings of the outer tube.

2. The film deposition apparatus of claim 1, wherein the inner member is configured with the tube member through which the reaction gas may be supplied, and wherein the gas conductance adjusting member is a gas ejection opening formed in the tube member.

3. The film deposition apparatus of claim 1, wherein the conductance adjusting member is a plurality of gas openings formed in the inner member so as to be formed in different areas in a circumferential direction and a longitudinal direction of the inner member; and wherein the motor rotates the inner member around the horizontal axis in order to move the plural gas ejection openings formed in different areas in the circumferential direction of the inner member closer to the gas ejection openings of the outer tube.

4. The film deposition apparatus of claim 1, wherein the inner member is configured with the rod member, and wherein the conductance adjusting member is a convex portion provided around the rod member capable of covering the gas ejection openings of the outer tube.

5. The film deposition apparatus of claim 4, wherein the motor rotates the rod member around a horizontal axis in order to move the convex portion closer to the gas ejection openings of the outer tube.

6. The film deposition apparatus of claim 5, wherein a plurality of the convex portions are formed around the rod member so that the plural convex portions are provided in different areas in a circumferential direction and a longitudinal direction of the rod member; and wherein the motor rotates the rod member around the horizontal axis in order to move the plural convex portions closer to the gas ejection openings of the outer tube.

7. The film deposition apparatus of claim 1, wherein the main gas supplying portion includes a first main gas supplying portion and a second main gas supplying portion that are away from each other along a direction in which the main gas supplying portion and the susceptor are rotated relative to each other, in order to supply a first reaction gas and a second reaction gas that reacts with the first reaction gas, respectively, to the upper surface of the susceptor, wherein the film deposition apparatus further comprises a separation area located between a first process area where the first reaction gas is supplied and a second process area where the second reaction gas is supplied along the direction of rotation, in order to separate atmospheres of the first and the second process areas, and wherein a layer of a reaction product is repeatedly formed by carrying out a cycle of alternately supplying the first reaction gas and the second reaction gas that react with each other to an upper surface of the substrate in the vacuum chamber, thereby depositing a film on the substrate.

8. The film deposition apparatus of claim 7, wherein the separation area includes a separation gas supplying portion for supplying a separation gas; and a ceiling surface configured to create a thin space with respect to the upper surface of the susceptor, the thin space allowing the separation gas to flow from the separation area to the first and the second process areas, wherein the ceiling surfaces are located with one ceiling surface on each side of the separation gas supplying portion in the direction of rotation.

9. The film deposition apparatus of claim 1, wherein the gas ejection openings of the first compensation gas nozzle do not overlap with the gas ejection openings of the second compensation gas nozzle in a circumferential direction of the susceptor.

10. The film deposition apparatus of claim 1, wherein the amount of the reaction gas supplied from the each of the first and second compensation gas nozzles is determined so as to increase a uniformity of the thickness of the film in the radius direction of the substrate.

* * * * *